(12) United States Patent
Kent et al.

(10) Patent No.: US 7,718,927 B2
(45) Date of Patent: May 18, 2010

(54) MICRO SOLDER POT

(75) Inventors: Harold B. Kent, Portola Valley, CA (US); James J. Levante, Redwood City, CA (US); Aaron T. Fine, San Jose, CA (US); Joseph R. Layton, Sunnyvale, CA (US)

(73) Assignee: MEDCONX, Inc., Santa Clara, CA (US)

( * ) Notice: Subject to any disclaimer, the term of this patent is extended or adjusted under 35 U.S.C. 154(b) by 746 days.

(21) Appl. No.: 11/375,797

(22) Filed: Mar. 14, 2006

(65) Prior Publication Data

US 2006/0285279 A1 Dec. 21, 2006

Related U.S. Application Data

(60) Provisional application No. 60/662,454, filed on Mar. 15, 2005.

(51) Int. Cl.
*B23K 1/00* (2006.01)
*B23K 3/00* (2006.01)
*B23K 3/06* (2006.01)
*B23K 3/08* (2006.01)

(52) U.S. Cl. ............ 219/421; 228/180.5; 228/179.1

(58) Field of Classification Search ............ None
See application file for complete search history.

(56) References Cited

U.S. PATENT DOCUMENTS 3,184,830 A * 5/1965 Weldon et al. ............ 228/180.1
3,444,617 A * 5/1969 Stricker et al. ............. 29/838
3,528,173 A * 9/1970 Gall ..................... 228/180.1
3,545,080 A * 12/1970 Evans ..................... 29/874
3,710,196 A * 1/1973 Fifield ..................... 439/876
4,595,816 A    6/1986 Hall et al.
4,775,337 A * 10/1988 Van Wagener et al. ...... 439/883
5,497,546 A * 3/1996 Kubo et al. ............. 228/179.1

(Continued)

FOREIGN PATENT DOCUMENTS

JP          02-013770          1/1990

(Continued)

OTHER PUBLICATIONS

International Search Report for corresponding PCT Application (PCT/US06/09669), 2 pages, Dated Sep. 25, 2007.

(Continued)

*Primary Examiner*—Joseph M Pelham
(74) *Attorney, Agent, or Firm*—Jones Day

(57) ABSTRACT

A micro solder pot includes a dielectric substrate having at least one hole formed therein, a conductive coating coupled to the interior of the hole, and at least one heat transfer pad spaced from the hole in thermal communication with the conductive coating of the hole. When the heat transfer pad is exposed to a heat source, the conductive coating inside the hole is heated. The micro solder pot may also include a thermally activated conductive material disposed within the hole. When the heat transfer pad is exposed to a heat source, the thermally activated conductive material becomes liquidus such that a component can be inserted into the liquidus material. When the heat source is removed, the thermally activated conductive material cools to couple the component to the conductive coating in the hole.

32 Claims, 24 Drawing Sheets

U.S. PATENT DOCUMENTS

| | | | | |
|---|---|---|---|---|
| 5,639,247 | A | * | 6/1997 | Johnson et al. ............... 439/74 |
| 5,730,932 | A | * | 3/1998 | Sarkhel et al. .............. 420/562 |
| 5,743,004 | A | * | 4/1998 | Chobot et al. ................. 29/830 |
| 5,779,134 | A | * | 7/1998 | Watson et al. ........... 228/179.1 |
| 5,796,163 | A | * | 8/1998 | Glenn et al. ................ 257/698 |
| 6,297,942 | B1 | * | 10/2001 | Azuma et al. .............. 361/307 |
| 6,462,285 | B2 | * | 10/2002 | Enroth et al. ........... 228/180.1 |
| 6,929,169 | B2 | * | 8/2005 | Kubokawa et al. ....... 228/180.1 |
| 6,963,494 | B2 | * | 11/2005 | Mickievicz et al. ......... 361/795 |
| 7,124,931 | B2 | * | 10/2006 | Lewis et al. ........... 228/180.22 |
| 2002/0187689 | A1 | * | 12/2002 | Suetsugu et al. ............ 439/874 |
| 2005/0263322 | A1 | * | 12/2005 | Mickievicz et al. ......... 174/260 |

FOREIGN PATENT DOCUMENTS

| | | | |
|---|---|---|---|
| JP | 06275738 A | * | 9/1994 |
| JP | 07 030240 | | 1/1995 |
| JP | 08-316626 | | 11/1996 |
| JP | 09-055565 | | 2/1997 |
| JP | 2000-114701 | | 4/2000 |
| JP | 2002374051 A | * | 12/2002 |

OTHER PUBLICATIONS

International Search report from corresponding PCT Application No. PCT/US06/09669.

Written Opinion from corresponding PCT Application No. PCT/US06/09669.

* cited by examiner

MICRO SOLDER POT

CROSS-REFERENCE TO RELATED APPLICATION

This application claims priority to U.S. Provisional Application No. 60/662,454, filed Mar. 15, 2005, now abandoned.

FIELD

This disclosure generally relates to soldering techniques and more particularly to a technique and apparatus for soldering a fine wire using a micro solder pot.

BACKGROUND

One of the most common methods of wire termination in connectors is hand soldering wires to a solder cup. Solder cups can be formed to match a specific wire size and are almost always formed as part of a contact pin, saving space inside a cramped connector. Unfortunately, solder cups require very careful hand soldering by skilled workers, because the heating of one cup can unsolder its neighbors. Solder cups also must be carefully arranged in the connector so as to keep their openings always facing outwards from their center. It is also very difficult to prepare solder cups in advance for termination. The assembly process requires starting in the middle of a connector and soldering the wires to the center solder cups first and slowly working out toward the outer concentric circles of solder cups. If there are any problems with joints in the middle, the rework process is very difficult. It is extraordinarily difficult to produce high quality hand soldered joints under these constraints. In addition, these carefully crafted joints must be cleaned with solvents and often mechanically brushed to remove flux residue. This leads to mechanical stress on the wires and solder joints and often causes electrical failures.

As the wires used in interconnections get smaller, the difficulties involved with using solder cups increases greatly. For example, hand soldering wires which are 0.002 inch in diameter (smaller than the diameter of a human hair) in very soft metallic materials, such as silver or copper, leads to many failures. Burned flux, oxidation, and other contaminants from soldering irons also often migrate into the joints and contaminate them. In addition, the mechanical leverage of applying a soldering iron is large and this also can lead to breakage of the fine wires during assembly. The mechanical and solvent cleaning processes also lead to breakage.

SUMMARY

A micro solder pot is described for coupling a component to a dielectric substrate, such as a PCB.

DETAILED DESCRIPTION

A micro solder pot is utilized for attaching a component, such as a wire, to a substrate, such as a printed circuit board ("PCB"). In one example, the micro solder pot is formed by a copper plated hole disposed within a substrate. A heat transfer pad is in thermal communication with the hole and hence the plating in the hole. Connection solder is disposed within the hole such that a wire can be inserted into the connection solder when it is heated. The connection solder is heated utilizing one or more heat transfer pads that are acted upon by a heat source in thermal communication with the heat transfer pad. The connection solder cools and hardens when the heat source is removed. As a result, the component is attached to the substrate in such a way that the component is both mechanically restrained, and, when required, is in electrical communication with the other components on the substrate.

Solder may be applied to the heat transfer pad in order to facilitate the transfer of heat between an external heat source and the heat transfer pad, although this is not absolutely required. An applied dielectric, such as a solder mask or other known applied dielectrics, may be used to prevent the heat transfer solder from mixing with the connection solder so as to prevent contamination of the component solder joint.

The hole may include a countersink, counter bore, or other formation therein for facilitating insertion of the component, for containing additional amounts of connection solder, and/or for space and electrical trace routing reasons. The plating of the hole can be extended to form an annular ring on the surface of the substrate around the hole, as well as form a heat transfer pad. Where the component is a wire, the wire is typically stripped and sometimes twisted and "tinned" with solder, prior to insertion into the micro solder pot. The end of the wire to be inserted into the micro solder pot can be formed or bent in order to enhance mechanical retention, and increase electrical performance, in the solder.

The example process allows the pre-tinning and pre-cleaning of both the wire and the pre-tinning and pre-cleaning of the micro solder pot on the substrate. Then the micro solder pot can be reflowed using the heat transfer pad, and the wire can be soldered to the micro solder pot on the substrate without the use of any additional flux. This allows the creation of high quality solder joints without ever physically touching the fine wire with a soldering iron or other heat source. In addition, there is no harsh cleaning required. In the specialty of lifesaving medical devices, this system and process leads to large direct labor savings to yield improvements of as much as 30%. There is a concomitant increase in overall system quality and functionality.

Figure 1:
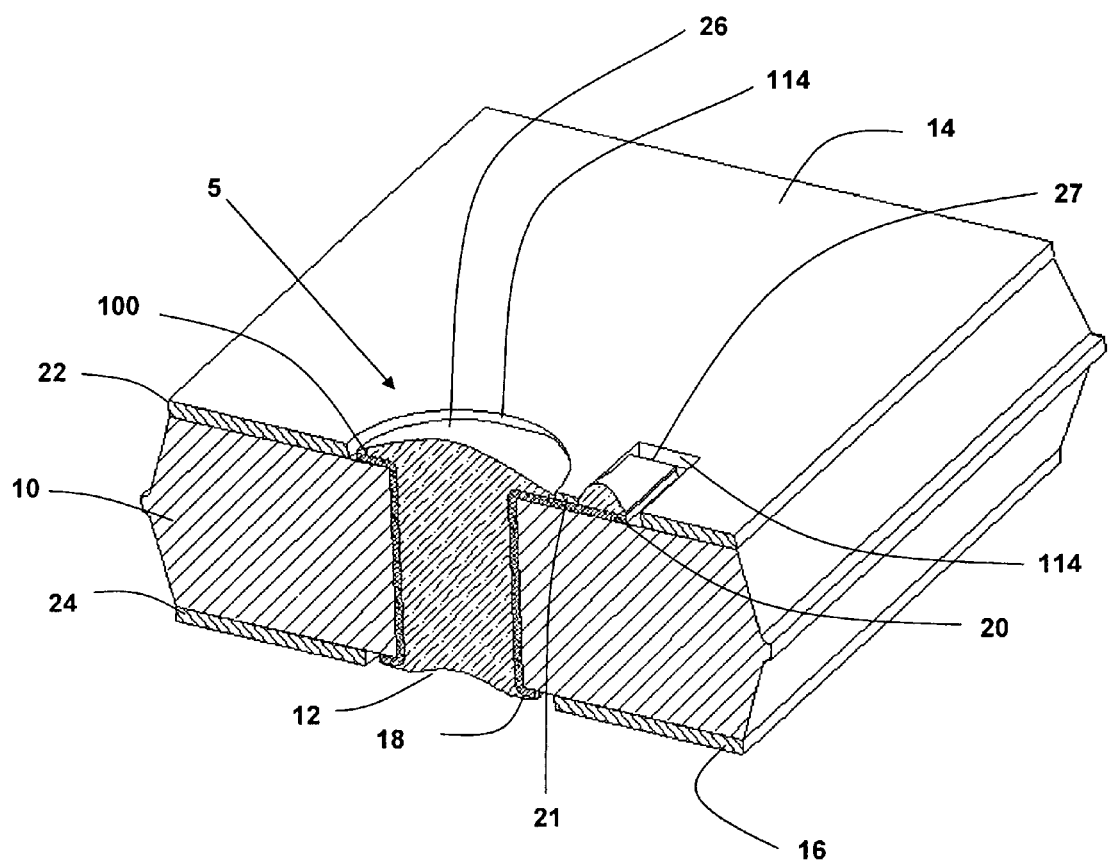
FIG. 1 is a cross-sectional view of an example micro solder pot with a heat transfer pad and heat transfer solder.

Referring now to the drawings, FIG. 1 illustrates a micro solder pot 5 for attaching a component, such as a wire 30, to an insulator or substrate 10. The term component, as used herein is meant to encompass all types of components that may be installed on an insulating substrate 10, such as a PCB. The terms component and wire may be used interchangeably herein. The terms together or alone are meant to encompass all types of components, including, wire, through hole components, surface mount components, springs, clips, and other known items that may be connected to a PCB. Insulator 10 may be a conventional printed circuit board made from fiberglass (i.e., FR-4) that has conductive traces formed thereon from rolled and annealed copper, plated copper, nickel, gold, etc. (though other substrate materials such as Polyimide, Polytetrafluoroethylene, ceramic laminates, woven glass, thermoplastics, Teflon, the like, and others can be used as direct replacements of the fiberglass and nearly any conductive material can be used as a direct replacement for the copper).

An opening or via 12 (also referred to herein as a "hole") is formed within insulator 10. The via 12 extends from a first top side 14 of insulator 10 to a second bottom side 16 of insulator 10. Alternatively, via 12 can be a blind hole that extends only partially through insulator 10. Via 12 can be of any geometry, so long as one side is open on the first side 14 or the second side 16 of substrate 10. The interior surfaces of via 12 are coated with a conductive material 18. The conductive material 18 is in electrical communication with the traces formed on substrate 10 in order to form the desired circuit pattern (not shown) on the substrate. The via 12 is filled with a filling material 26, such as solder, that is used to mechanically and/or electrically connect wire 30 to insulator 10. Alternatively, any formable, conductive material or layered series of materials may be used, e.g. conductive epoxy, silver ink, leaded solder, lead free solder, brazing, conductive polymers, plated metals, sprayed or sputtered metals, electrodeposited metals, etc., as the filling material 26. If electrical conductivity is not required, then the material need only be thermally formable.

As seen in FIG. 1, conductive material 18 extends from hole 12 and forms a conductive structure 100 adjacent to and optimally surrounding the perpendicular planar surface around via 12. This conductive structure 100 is an annular ring around the hole 12, in the case of a circular hole, or could be any shape that surrounds the periphery of the hole. The conductive material 18 may be recessed into the top surface 14 of the substrate 10, or positioned on the top surface 14.

The conductive structure 100 is thermally coupled to the conductive material 18 positioned on the interior of the holes 12. While this conductive material 18 defining the conductive structure 100 is shown completely surrounding the planar surface of the via 12, it may only partially surround the via 12, if so desired. Furthermore, the conductive material 18 that is coupled to the via 12 includes a path or bounded layer of conductive material that extends away from conductive structure 100 on the top side 14 of insulator 10. This path or bounded layer forms the heat transfer pad 20. A heat transfer conduit 21 is also formed in some examples. The heat transfer conduit 21 is the conductive material 18 that extends between the heat transfer pad 20 and conductive structure 100, when present, or the via 12, when the conductive structure 100 is not present. A heat transfer material 27, such as solder, may be positioned or deposited on top of the heat transfer pad 20. As discussed later, the heat transfer material 27 is optional.

The conductive material 18 that extends from the hole 12 to the pad 20 may be a single material, or multiple materials. In one example, the conductive material 18 may be copper that extends from the interior of the hole 12, around the conductive structure 100, along the heat transfer conduit 21 and over the heat transfer pad 20. In another example, different conductive materials may be used for parts of the conductive material 18. For example, the coating within the hole 12 could be copper while the conductive material 18 on the top surface 14 of the substrate 10 could be another conductive material. The heat transfer material could be thermally conductive while being an electrical insulator.

As shown in FIG. 1, top dielectric 22 is positioned over the substrate 10 and the heat transfer conduit 21, which is a portion of the conductive layer 18. The via 12, a surface area 114 around the via, and the heat transfer pad 20 are exposed. The interior wall of via 12, as well as conductive structure 100, are in thermal communication with the heat transfer pad 20 because they are connected together by the heat transfer conduit 21 of conductive material 18 under the top dielectric 22. The top dielectric 22 may be a solder mask. A bottom dielectric or solder mask could also be provided.

Figure 2:
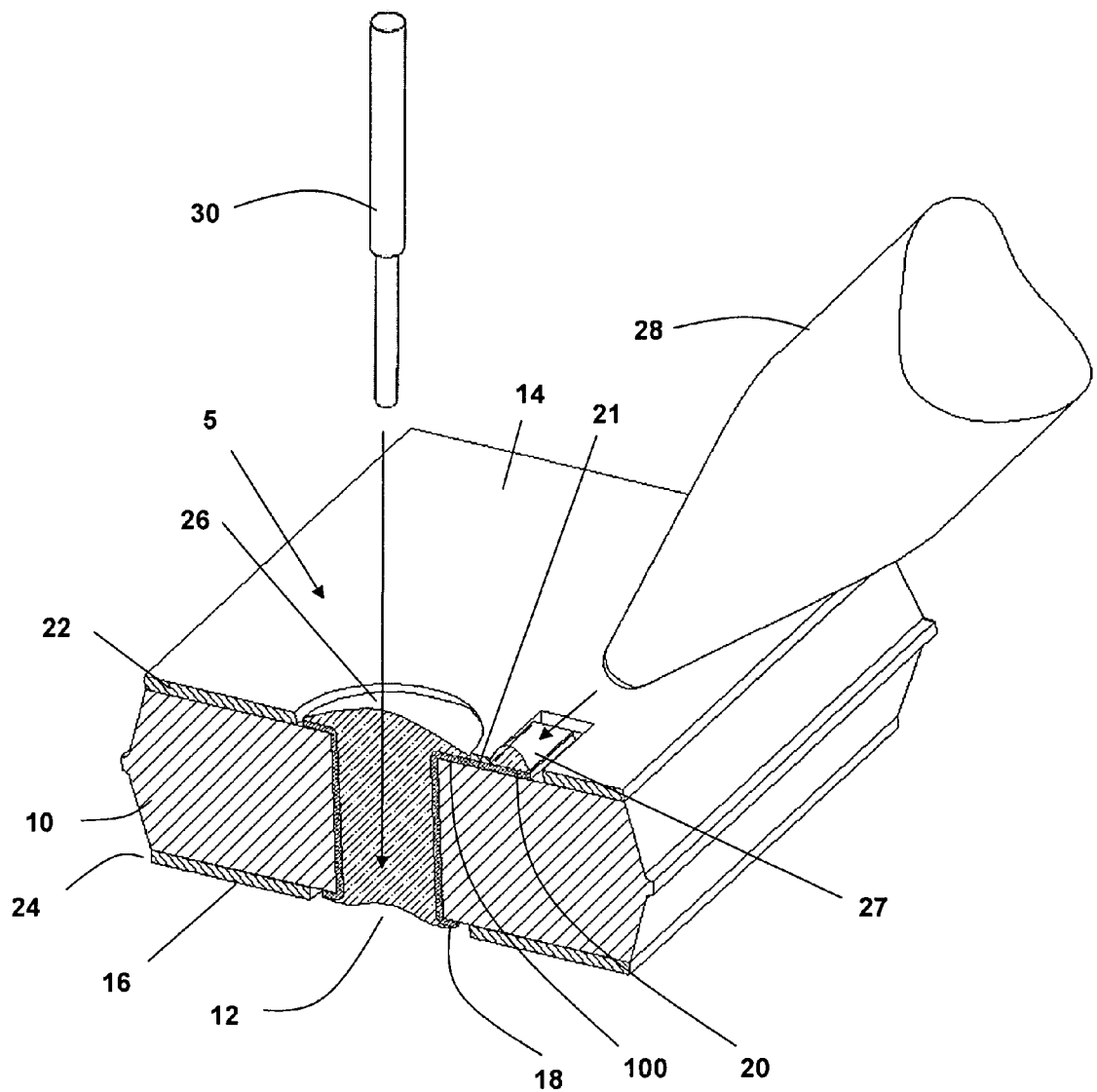
FIG. 2 is a cross-sectional view of the micro solder pot of FIG. 1 shown just prior to applying heat with a soldering iron to the heat transfer pad.

The top dielectric 22 is applied to the top side 14 of insulator 10 in order to prevent the filling material 26 from flowing over the top side 14 of insulator 10, to aid in visual identification of via 12 and heat transfer pad 20, to provide for mechanical separation of heat transfer pad 20 from conductive structure 100, and/or to avoid the mixing of the filling material 26 with heat transfer material 27. In addition, soldering irons 28, shown in FIG. 2, are often themselves coated with solder so that when they are applied to the heat transfer pad 20, some solder will travel from the tip of the soldering iron 28. The solder mask 22, thus, prevents mixing of solder between the heat transfer pad 20 and the via 12 and between residual solder left on the heating element or soldering iron 28 and the via 12. In some examples, top dielectric 22 is formed such that when large amounts of solder are flowed over the top of via 12 and conductive structure 100, as well as over the heat transfer pad 20, filling material 26 and the heat transfer material 27 can remain separated.

As seen in FIG. 1, top dielectric 22 does not allow filling material 26 to flow between via 12 and heat transfer pad 20, or vice-versa. Similarly, bottom dielectric 24 is applied to the second side 16 of insulator 10. Bottom dielectric 24, which may be a solder mask, has an opening formed therein to allow filling material 26 to also flow through via 12 and onto another conductive structure 100 disposed on the bottom side 16 of insulator 10. The separation of the heat transfer material 27 from filling material 26 keeps the heat source (not shown) from contaminating filling material 26 while increasing the thermal communication between the heat source and the heat transfer pad 20.

As previously discussed, the heat transfer material 27 is optional. The heat transfer material is advantageous because it facilitates the transfer of heat from a heating element 28, such as a soldering iron, to the heat transfer pad 20, the conductive material 18, and, ultimately, the filling material 26.

In one example, via 12 is filled with filling material 26 by sending the first side 14 of the insulator 10 through a wave solder machine (not shown). Solder from the wave solder machine flows into via 12 as insulator 10 passes through the machine. Furthermore, the heat transfer material 27 may be applied to heat transfer pad 20 at the same time as insulator 10 moves through the machine.

As shown in FIG. 2, in order to attach wire 30 to insulator 10 and, hence, to the conductive material 18, thermal energy is transferred from the tip of heating element 28 to the heat transfer material 27. As the tip of heating element 28 touches the heat transfer material 27 on the heat transfer pad 20, the heat transfer material 27 reaches its liquidus point and wicks up to heating element 28, thereby greatly enhancing the thermal communication between heating element 28 and conductive material 18 on the heating pad 20. Thermal energy travels through the heat transfer conduit and from there to the conductive structure 100, and hence into the conductive material 18 coated on the walls of via 12, and inwardly from there toward filling material 26. As the filling material 26 absorbs this thermal energy, it reaches its liquidus point and becomes ready for use without the need for heating element 28 to ever touch filling material 26 or wire 30. Accordingly, it is possible to go between leaded and lead free applications without having to change heating element 28, provided the desired filling material 26 is applied to via 12. This is especially true if the heat transfer material 27 is not applied to heat transfer pad 20.

Figure 3:
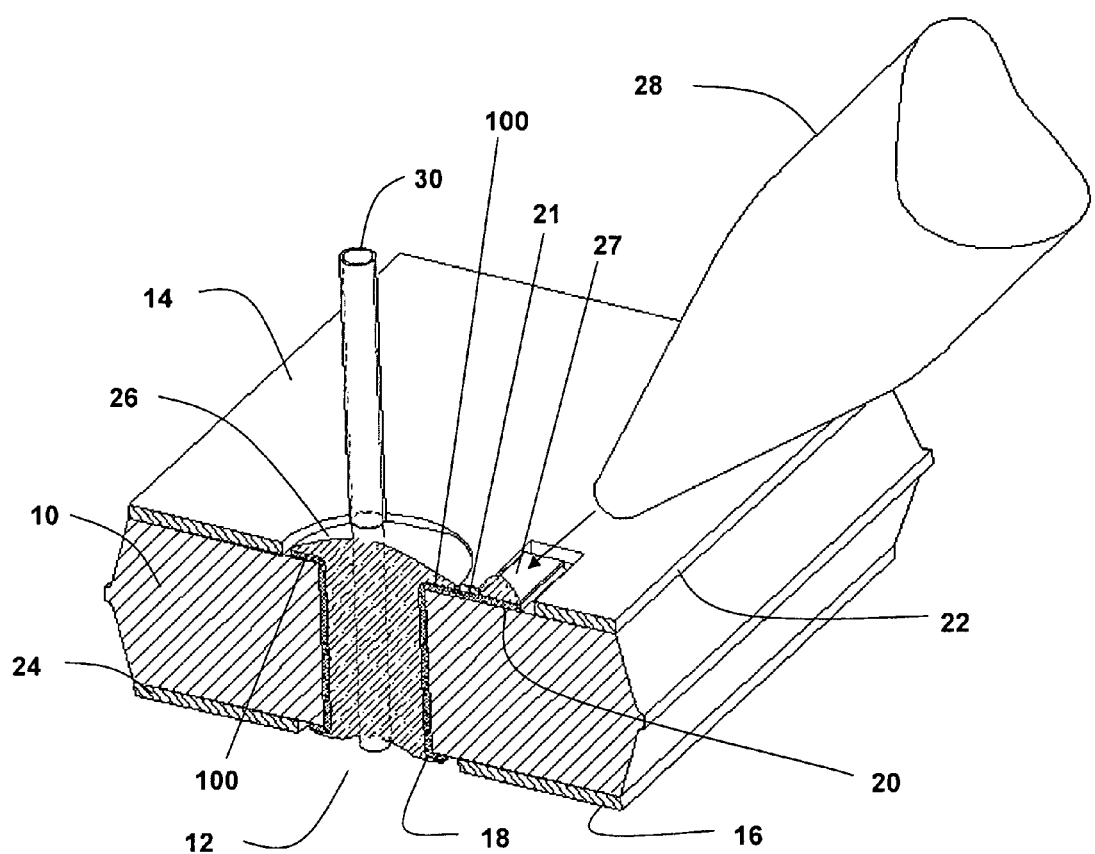
FIG. 3 is a cross-sectional view of the micro solder pot of FIG. 1 with a wire inserted therein.

As shown in FIG. 3, once filling material 26 within via 12 is heated to its liquidus point, wire or component 30, which has preferably been stripped of its insulation (if needed), its inner conductors twisted and tinned (if needed), is then inserted into via 12 and filling material 26. Wire 30 is preferably inserted past the first side 14 of insulator 10 until the end of the wire 30 is either flush with or past the second side 16 of the insulator 10. It will be recognized by those of ordinary skill in the art that it may also be possible to insert wire 30 from the second side 16 of the substrate 10 as easily as it is to insert wire 30 from the first side 16. A good solder joint is formed between filling material 26 and wire 30 as heat from filling material 26 heats wire 30 and causes filling material 26 to wick towards wire 30. The continued heat being applied from heating element 28 to heat transfer pad 20 during the insertion of wire 30 ensures that proper wetting of wire 30 occurs. After wire 30 has been inserted, heating element 28 is removed from heat transfer pad 20, which allows natural convection and other such methods to quickly bring the temperature of the filling material 26 down below its liquidus point, which solidifies the joint between the wire 30 and the via 12.

Figure 4A:
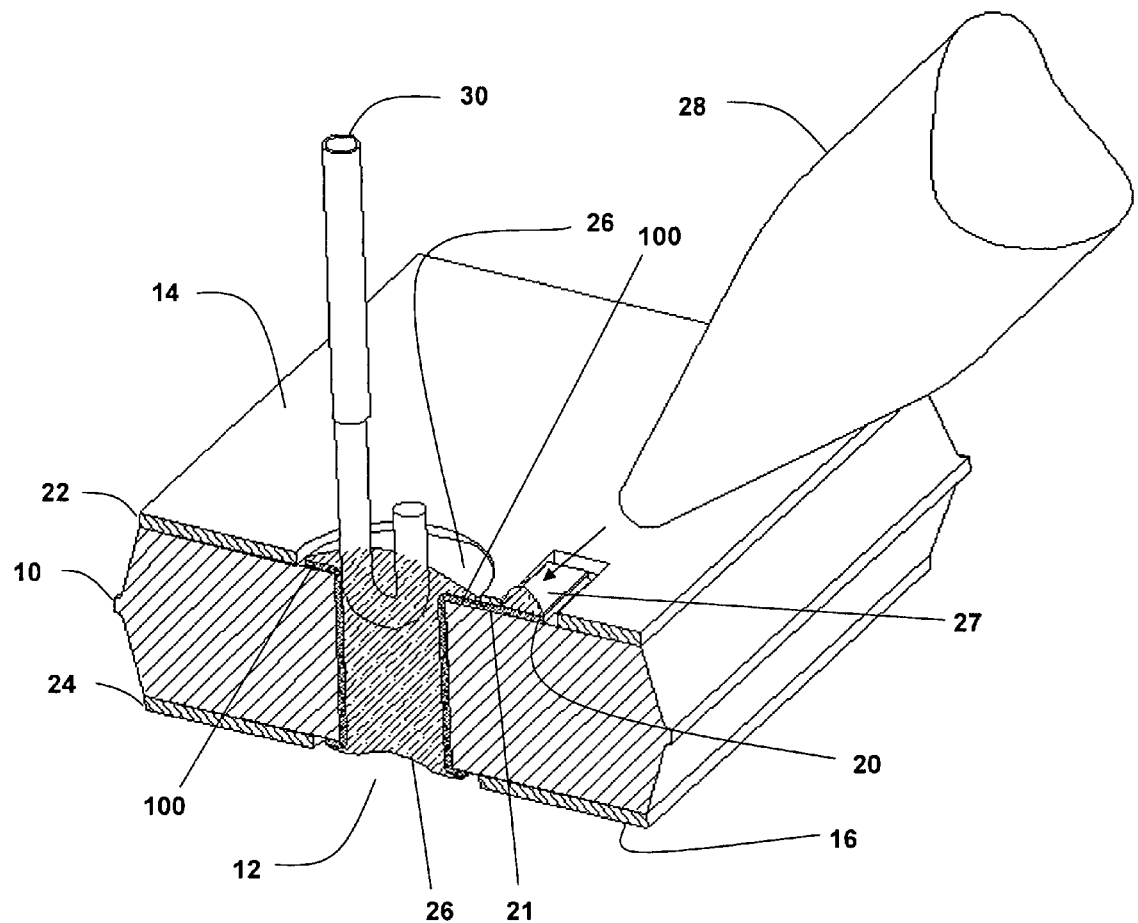
FIG. 4A is a cross-sectional view of the micro solder pot of FIG. 1 with a wire having a "J" bend inserted therein.

In order to attach "hard to solder materials" such as stainless steel, chromel, alumel, constantan, and other such materials, wire 30 may contain a formed end such as a "J" or a "Z" bend at the tip, among other shapes. Referring to FIG. 4A, the tip of wire 30 is shown formed into a "J" that is inserted into the filling material 26 after the heat from heating element 28 has brought the filling material 26 to its liquidus point. Wire 30 is preferably stripped, twisted, and tinned prior to forming and inserting the "J" into the filling material 26. However, the nature of the micro solder pot system causes many of the impurities contained within the filling material 26 to rise near the surface 14, where the impurities have little effect on the electromechanical performance of the final joint. This means that wire 30 need not have its insulation removed prior to insertion into the filling material 26. The shaped end provides mechanical retention of wire 30 within via 12 by becoming encapsulated in melted filling material 26. Even if complete wetting does not occur between wire 30 and filling material 26, the bottom of the "J" being below the surface of the filling material 26 provides additional mechanical retention, and often increased electrical communication. This keeps wire 30 firmly in place once the thermal energy from heating element 28 stops being transmitted. The formed lead on the end of wire 30 may protrude completely through the filling material 26. Alternatively, the formed lead on the end of wire 30 may be positioned completely inside of the filling material 26.

Figure 4B:
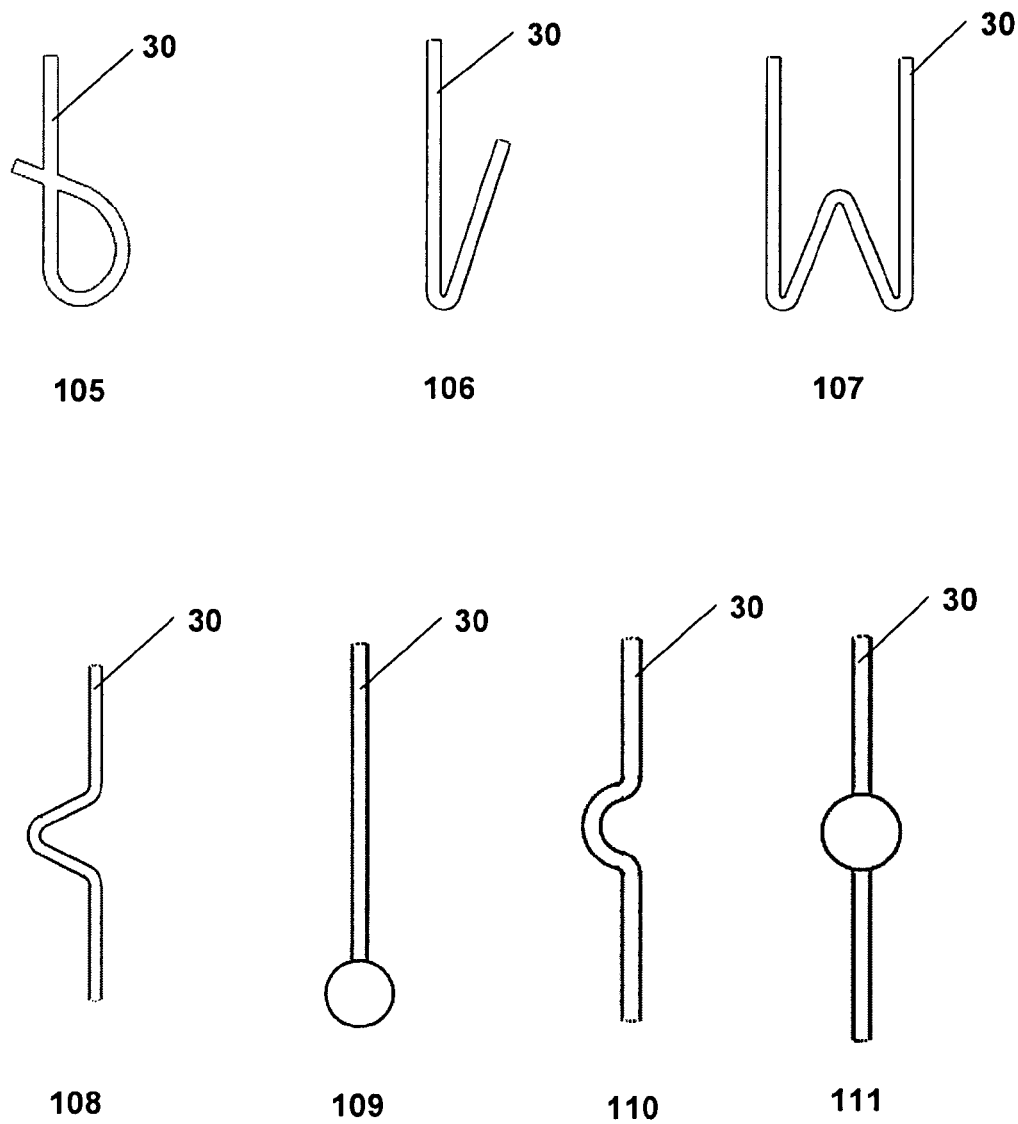
FIG. 4B is a side view of a plurality of different wire termination shapes.

FIG. 4B depicts a variety of wire configurations that may be utilized to improve the retention of the wire 30 in the micro solder pot 10. Wire 105 has a loop bend. Wire 106 has a "V" bend. Wire 107 has a "W" bend. Wire 108 has a "vertical V" bend. Wire 109 has an end ball. Wire 110 has a "C" bend, and wire 111 has a swaged end. These shaped wires may also provide an increase in electrical communication.

Figure 5A:
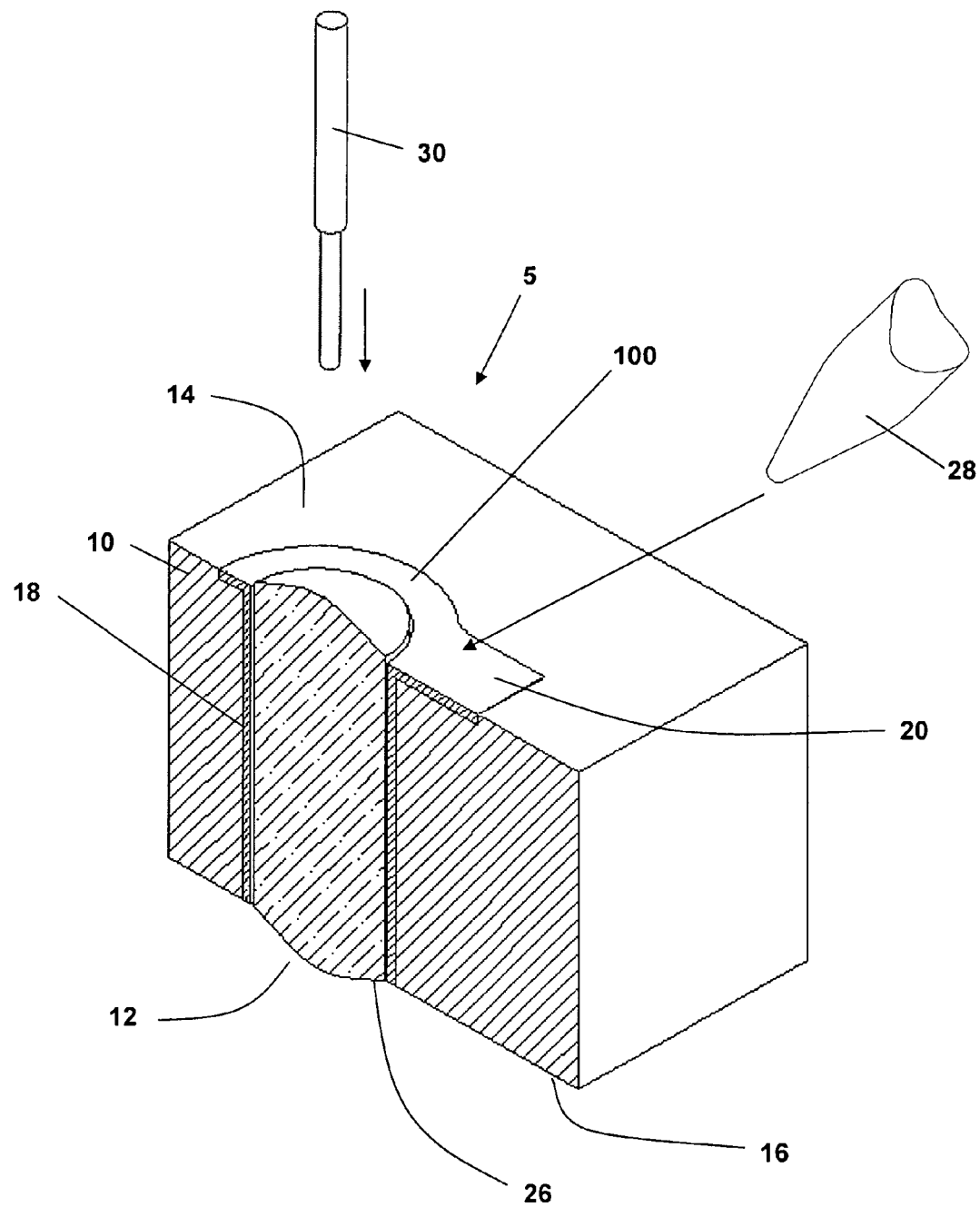
FIG. 5A is a cross-sectional view of another example micro solder pot without heat transfer solder applied to the heat transfer pad.

Referring to FIG. 5A, a micro solder pot 5 is shown without the heat transfer material 27 being positioned on the heat transfer pad 20. A top solder mask or dielectric 22 does not separate heat transfer pad 20 from conductive structure 100. In this example, the tip of heating element 28 is applied directly to the heat transfer pad 20 in order to transmit thermal energy through the conductive material 18 to the filling material 26. In all other respects, this example of micro solder pot 5 is identical to the example described above. In practice, because the heat transfer materials 27 helps to transmit thermal energy to the heat transfer pad, the example of FIG. 5A will, for otherwise identical structures, take longer to heat. As a result, it will take longer for the filling material 26 to heat to the liquidus stage.

Figure 5B:
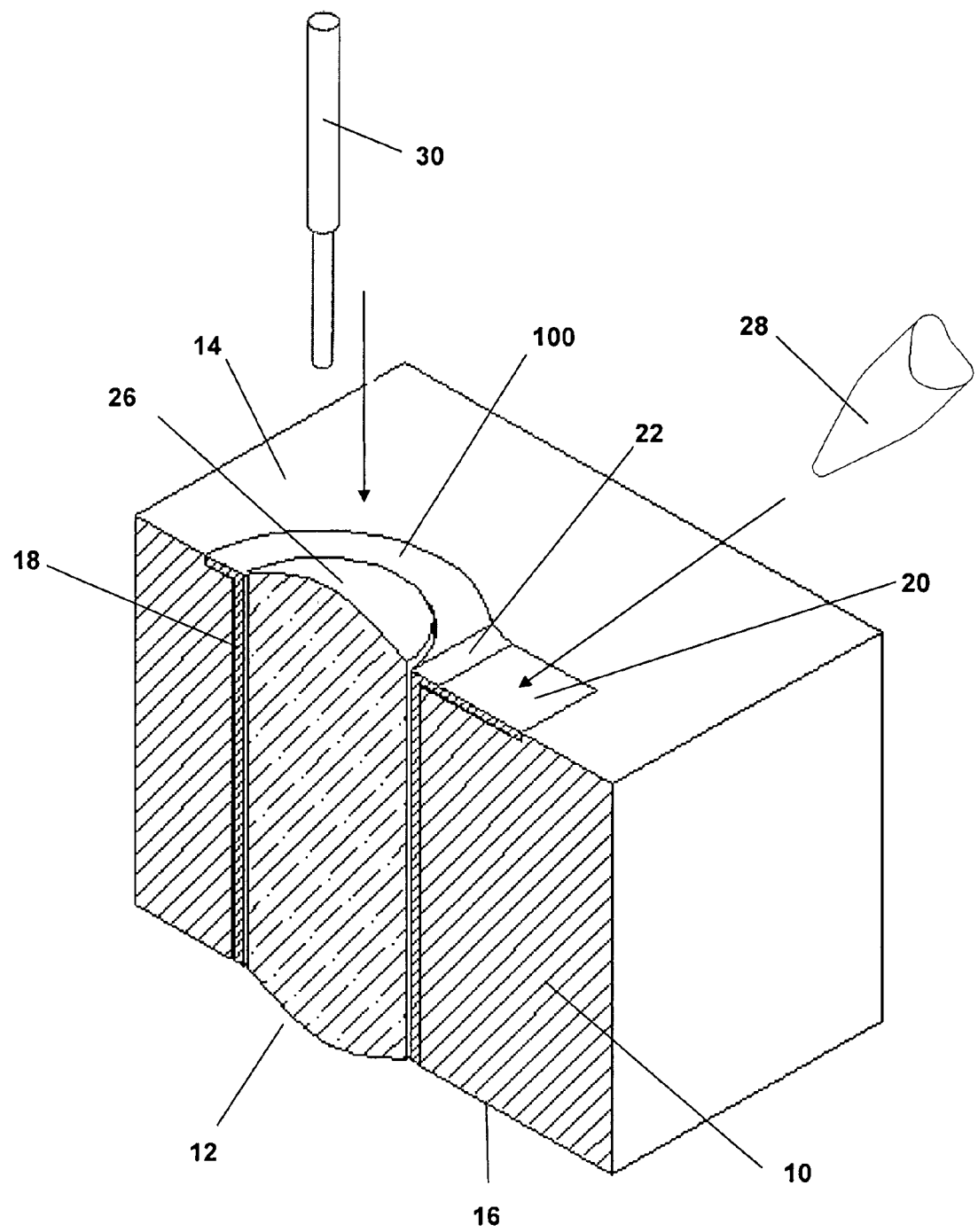
FIG. 5B is a cross-sectional view of yet another example micro solder pot similar to that shown in FIG. 5A, but with a solder mask applied between the heat transfer pad and the micro solder pot hole.
Figure 5C:
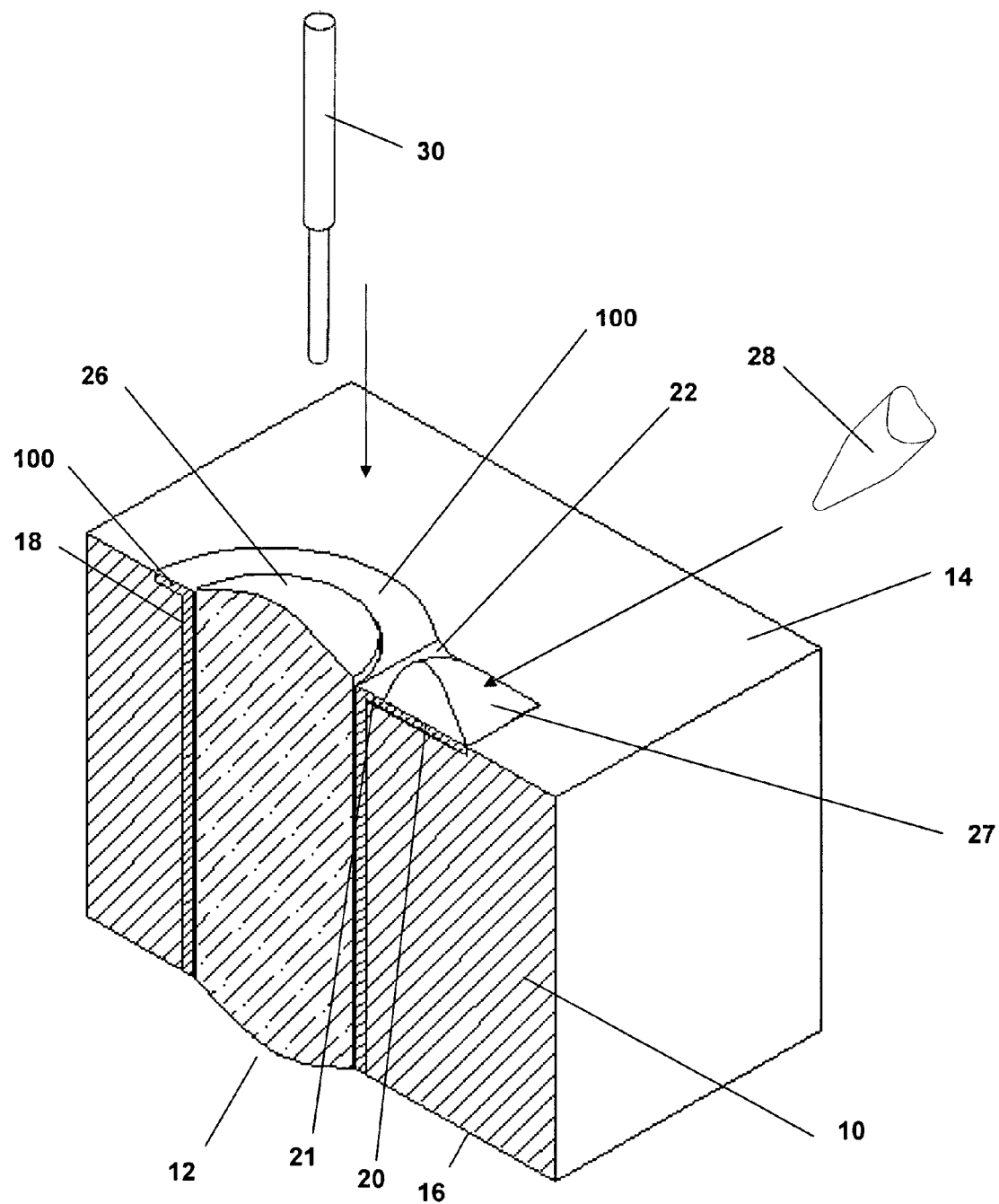
FIG. 5C is a cross-sectional view of a further example micro solder pot similar to that shown in FIG. 5B, but with a heat transfer solder applied to the heat transfer pad.

FIG. 5B is similar to FIG. 5A, but includes a dielectric or solder mask 22 that is positioned on top of the conductive structure 100. In operation, many heating elements 28 will have residues of solder on their tips. The solder mask 22 may be utilized even when the heat transfer material 27 is not present on the heat transfer pad 20 and can help to prevent residual solder that is left on the soldering iron 28 from entering the conductive structure 100 or the filling material 26. FIG. 5C adds the heat transfer material or solder bump 27 to the heat transfer pad 20. The dielectric 22 helps to deter solder from traveling between the heat transfer pad 20 and the filling material 26.

Figure 6:
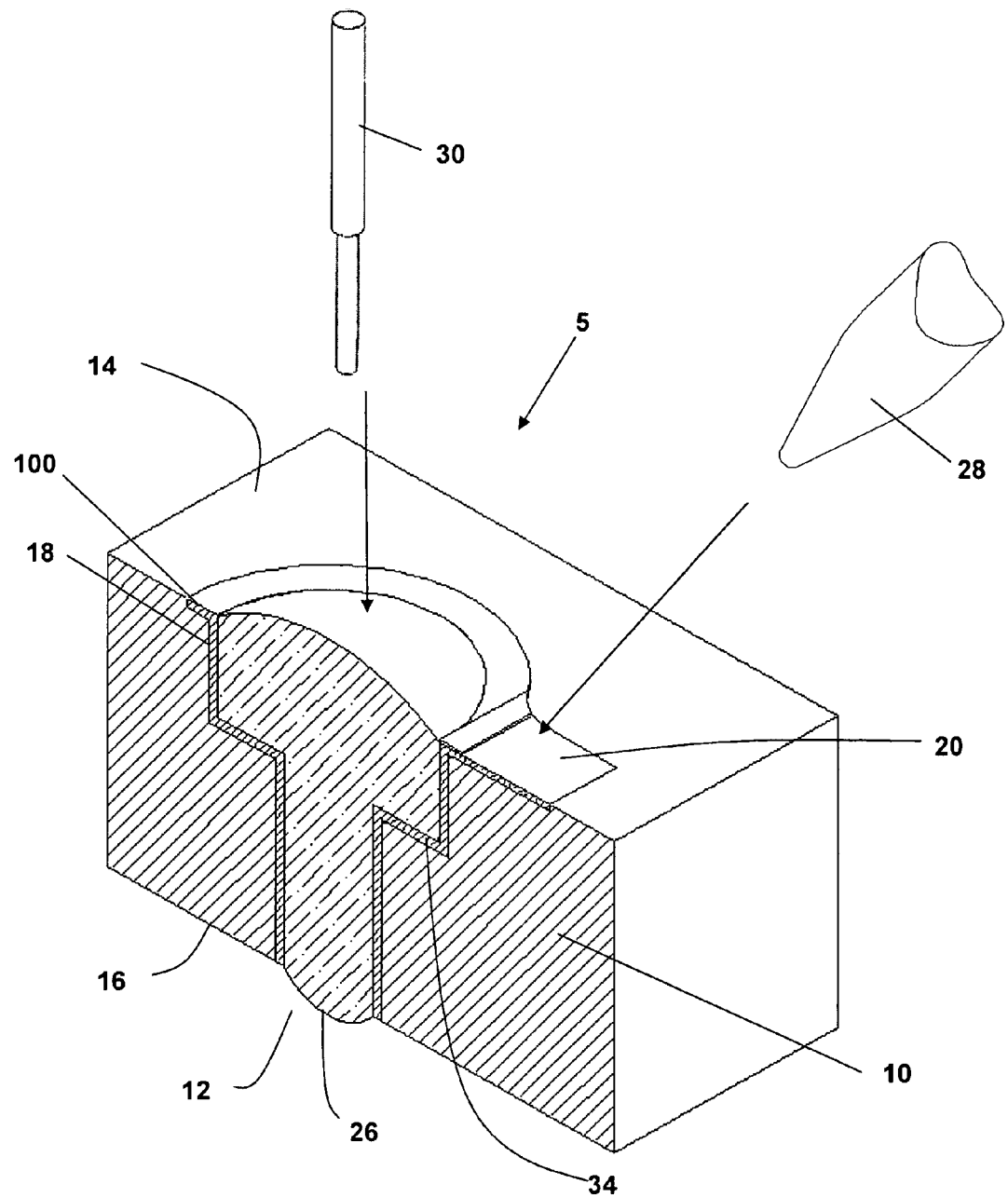
FIG. 6 is a cross-sectional view of another example micro solder pot with a counter bore formed therein and without heat transfer solder applied to the heat transfer pad.

FIG. 6 is similar to the example shown in FIG. 5A, but depicts a micro solder pot 5 that has a counter bore 34. Via 12 is formed with counter bore 34 extending from the first side 14 of insulator 10. Counter bore 34 allows for a controlled variation in the volume of the filling material 26 in predetermined areas inside of via 12, as well as providing an increased "target" to insert wire 30 into. This is especially useful when using a shaped tip with wire 30.

Figure 7:
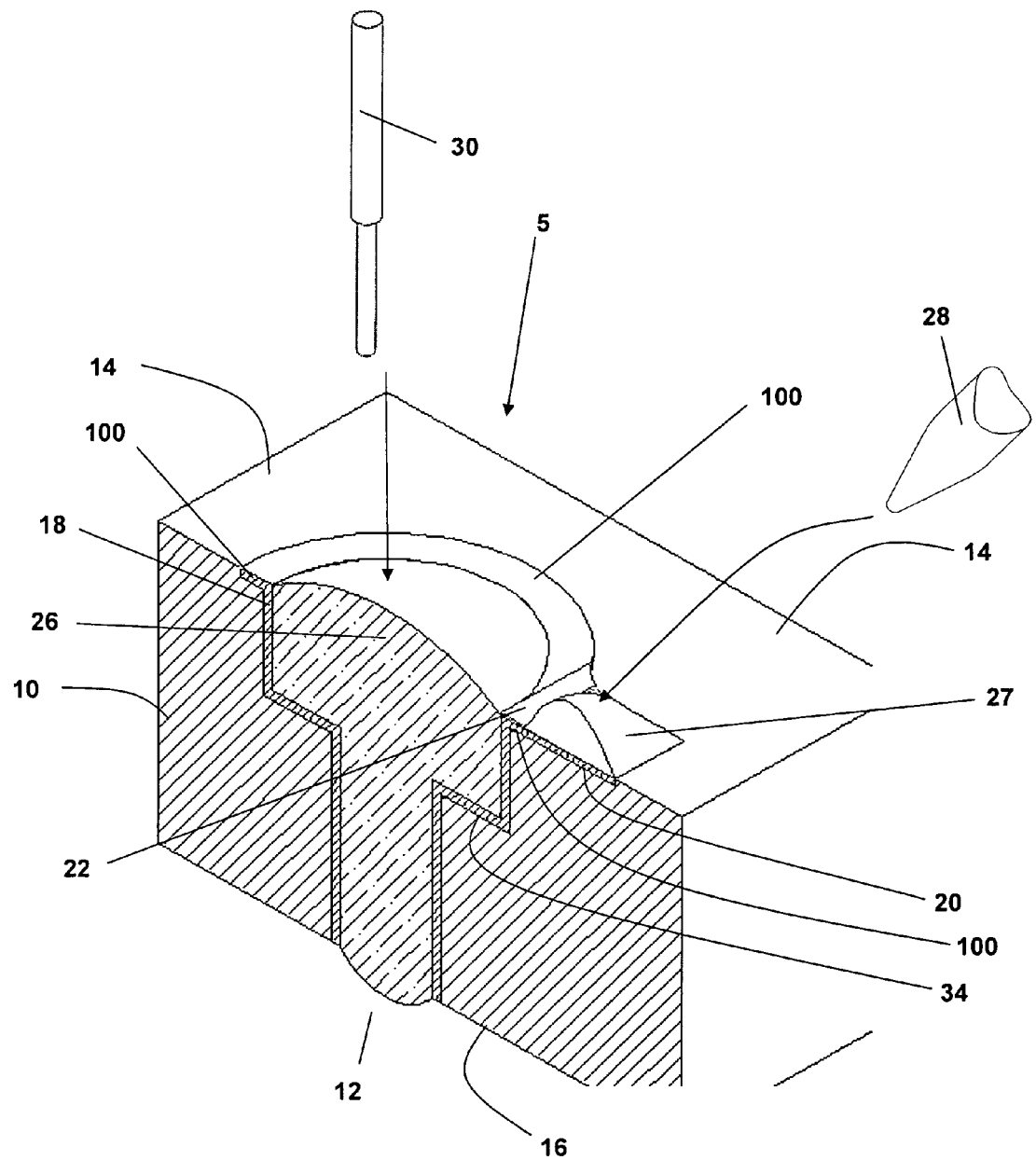
FIG. 7 is a cross-sectional view of an example micro solder pot with a counter bore formed therein having a heat transfer pad with heat transfer solder.

FIG. 7 is similar to the example shown in FIG. 6, but also includes the heat transfer material 27 deposited on the heat transfer pad 20. As previously described above, the heat transfer material 27 is applied to heat transfer pad 20 in order to increase the thermal communication between the heating element 28 and the filling material 26. Top dielectric 22 prevents the heat transfer material 27 from flowing into and contaminating the filling material 26.

Figure 8:
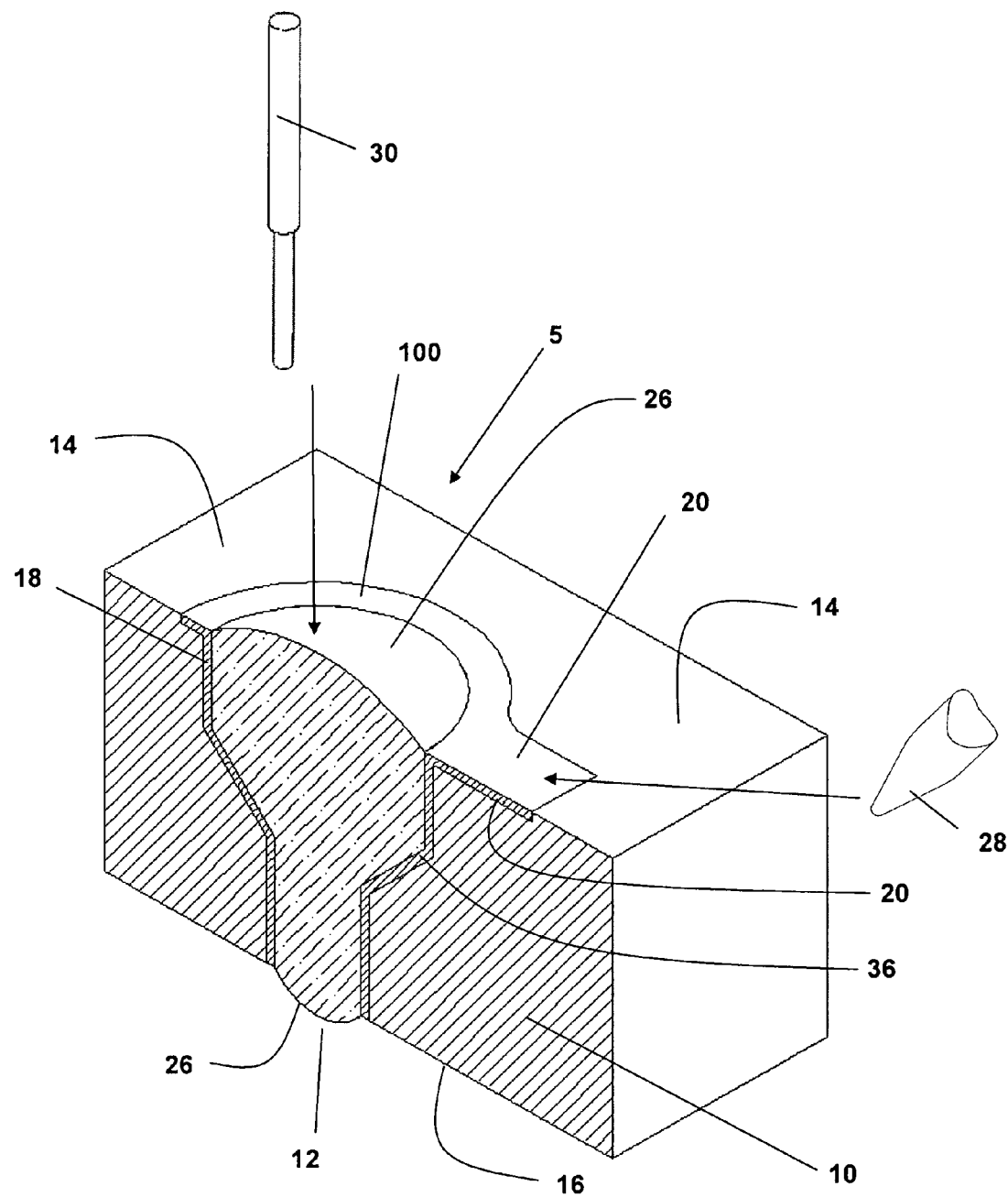
FIG. 8 is a cross-sectional view of an example micro solder pot with a counter sink formed therein and having a heat transfer pad without heat transfer solder.
Figure 9:
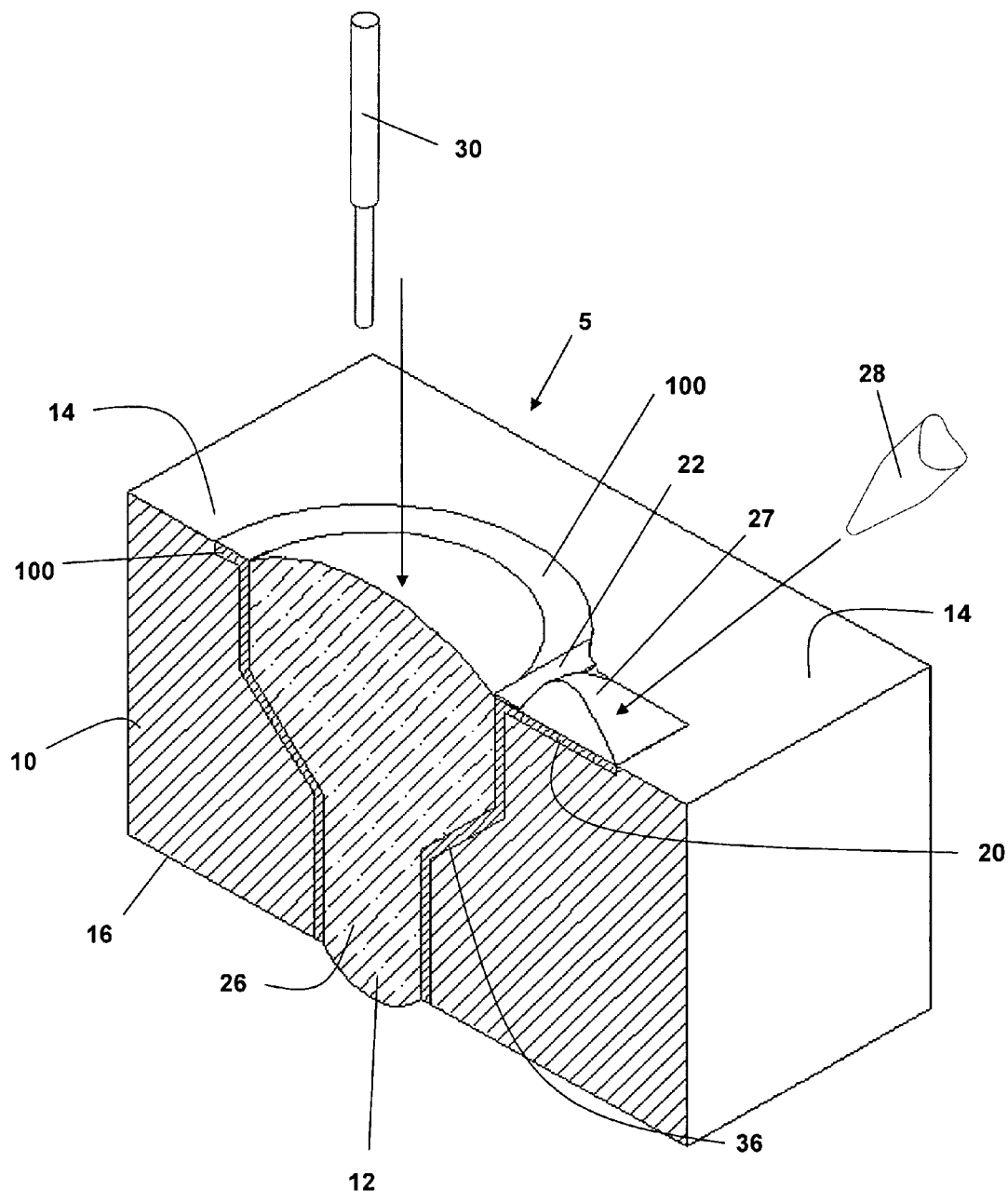
FIG. 9 is a cross-sectional view of an example micro solder pot with a counter sink formed therein and having a heat transfer pad with heat transfer solder.

FIGS. 8 and 9 show a micro solder pot 5 with a counter sink 36 both with and without the heat transfer material 27 present. Micro solder pot 5, as shown in FIG. 8, does not include the heat transfer material 27, while the micro solder pot 5 shown in FIG. 9 includes the heat transfer material 27. FIG. 9 also includes a top dielectric 22 that prevents the heat transfer material 27 from moving between heat transfer pad 20 and via 12. Counter sink 36 enables additional filling material 26 to be added to via 12, as well as providing a larger target area to insert the wire or component 30 with a smoother transition between the diameters involved than as with FIG. 6.

Figure 10A:
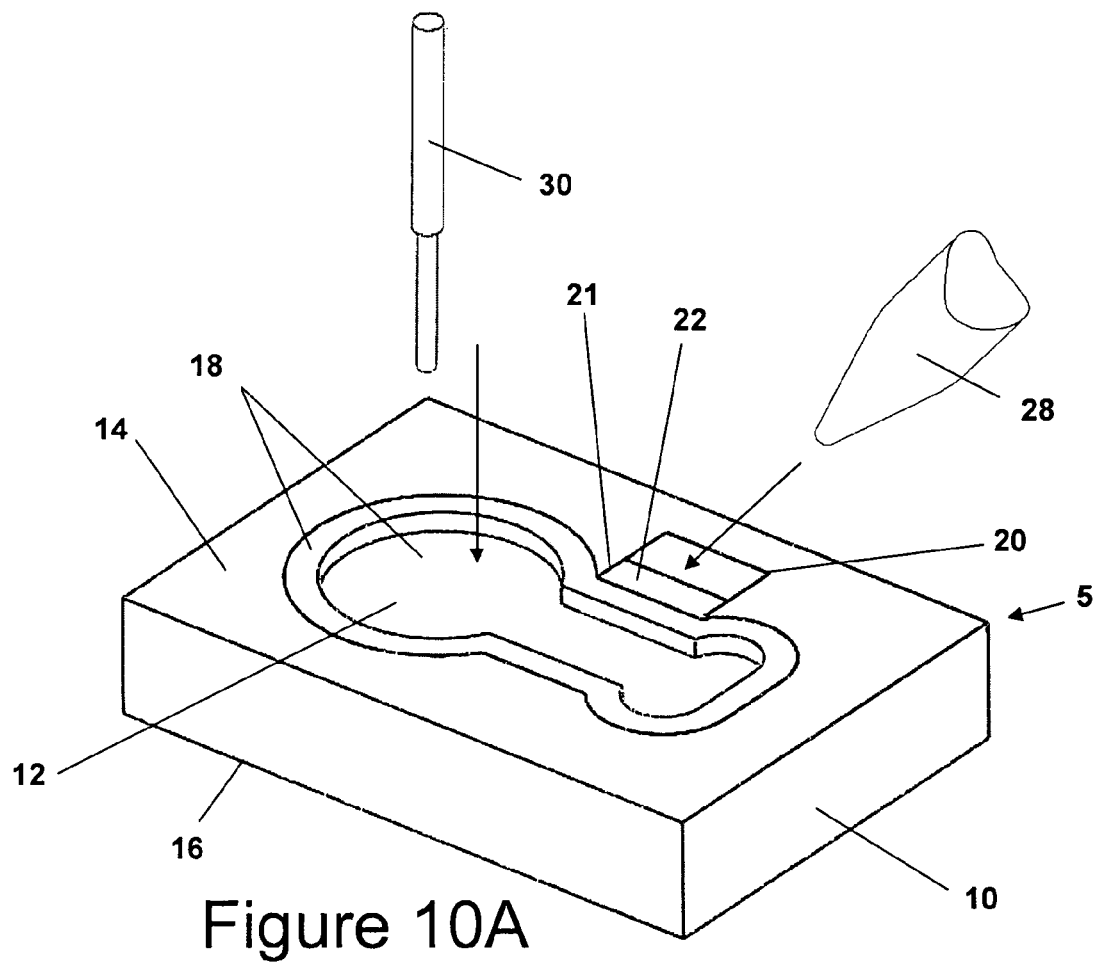
FIG. 10A is a perspective view of an example micro solder pot having an irregularly shaped blind hole micro solder pot.
Figure 10B:
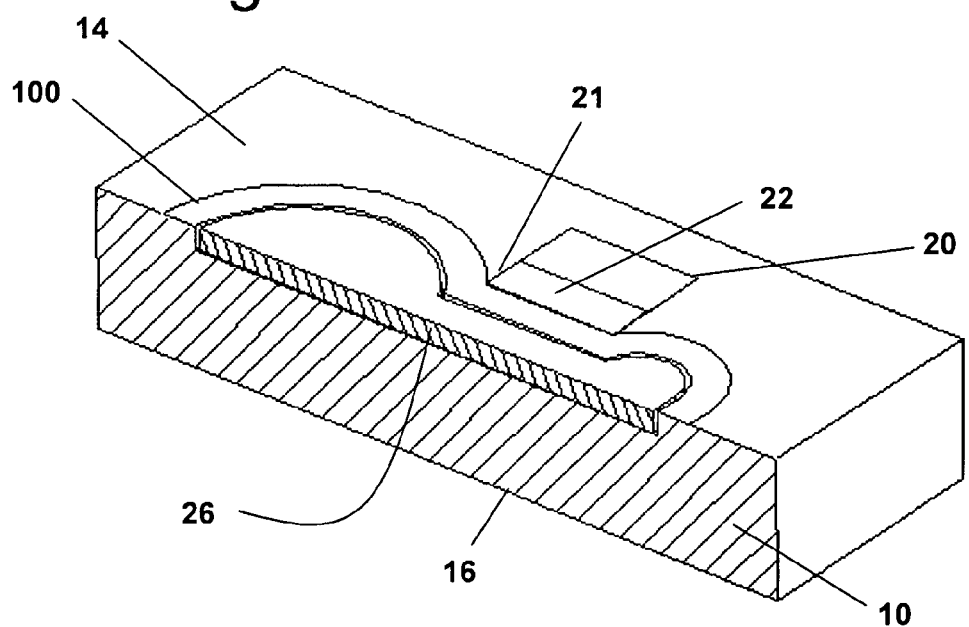
FIG. 10B is a cross-sectional perspective view of the micro solder pot shown in FIG. 10A, but with a solder positioned in the pot.

FIGS. 10A and 10B depict another example micro solder pot 5 installed on a substrate 10. The micro solder pot 5 has an irregular shape. In this example, the shape is similar to a key hole shape. The depicted blind hole provides greater solder volume such as may be needed for twisted wire, or other connectors. The present example micro solder pot 5 allows for variable shapes to encompass odd-shaped devices and multiple wires. This example does not utilize a through hole. Instead, the micro solder pot 5 is positioned in a recess or via 12 defined in the top surface of the substrate 10.

As shown in FIG. 10A, a conductive material 18 is positioned in the micro solder pot 5 at the bottom of the via 12, on the side walls of the via 12, and around the rim 100 of the via. The conductive material 18 around the via 12 extends to a heat transfer pad 20 along a heat transfer conduit 21, and a solder mask 22 or top dielectric is positioned between the heat transfer pad and the rim 100 of the conductive material 18. FIG. 10B shows a filling material 26, such as solder, positioned in the via. In FIG. 10B, the conductive material 18 is positioned only around the rim 100 of via 12, and is not deposited on the bottom surface of the via 12 or on the interior side walls of the via 12. The example of FIG. 10A is easily filled with solder 26 using a wave solder machine, while the example of FIG. 10B, which does not have a conductive material on the bottom surface of the hole, is better filled with such techniques as stenciling or injection solder paste using a pneumatic syringe, among other known filling techniques.

Figure 11:
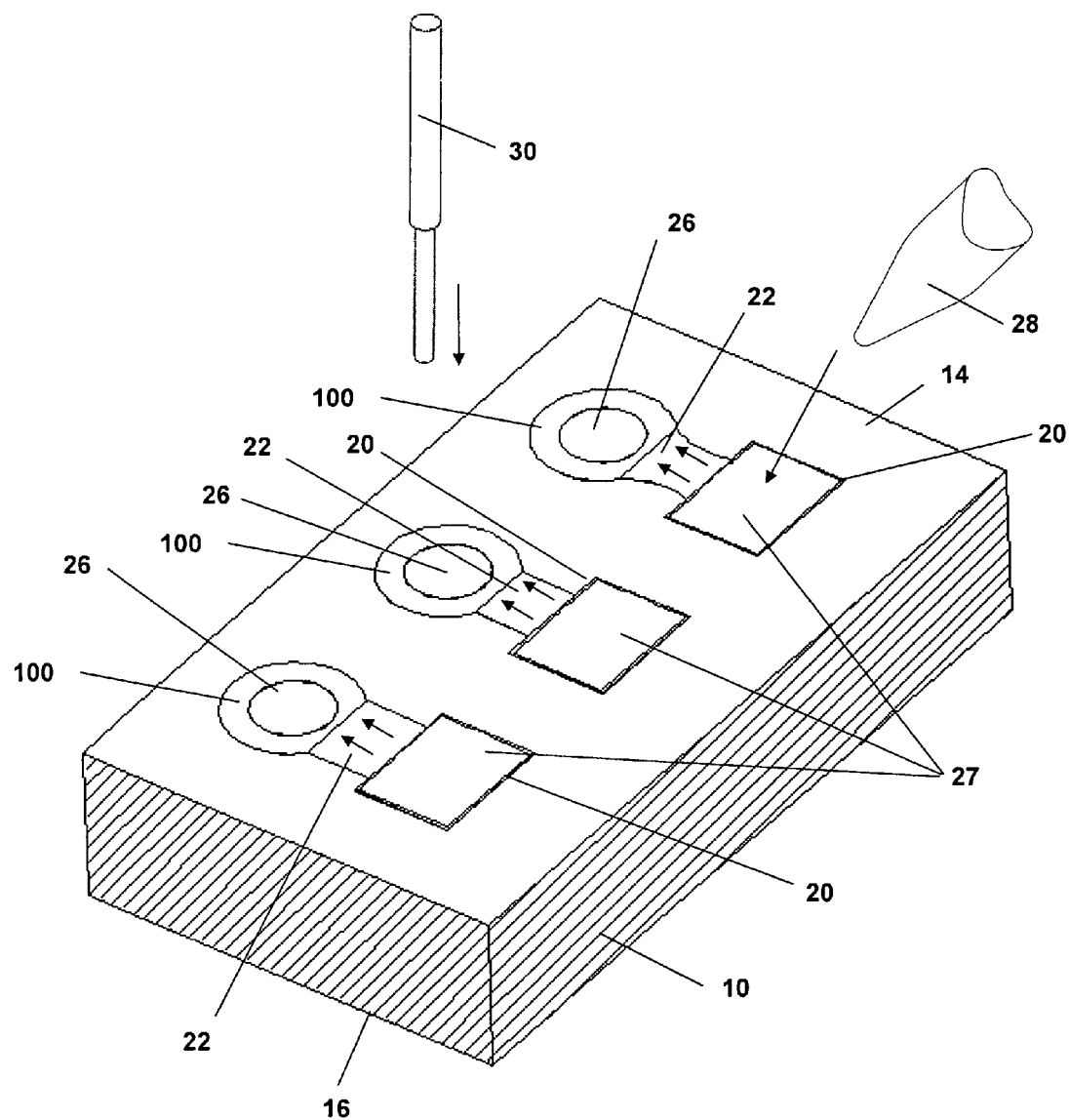
FIG. 11 is a perspective view of an alternative example of the micro solder pot where multiple pots are arranged on a substrate, with each of the micro solder pots utilizing a heat transfer pad of a different size and configuration from the other heat transfer pads.

FIG. 11 shows three different micro solder pot 5 configurations arranged on the first side 14 of substrate 10. The depicted example shows how different sized heat transfer conduits 21 may be utilized in connection with vias 12. The micro solder pots 5 have a through hole 12 filled with filler material 26 and an annular ring 100 of conductive material provides a conductive structure 100 around each through hole or via 12. The heat transfer pad 20 is thermally coupled to the conductive structure 100 by a heat transfer conduit 21. An insulating dielectric 22 or solder mask, is positioned over the conductive material 18 between the heat transfer pad 20 and the conductive structure 100 around the rim of the via 12. In addition, a heat transfer material 27 is positioned on each heat transfer pad 20.

There are three different solder pot 5 arrangements positioned on substrate 10. The left-most solder pot 5 has a larger area of conductive material 18 (shown in FIG. 5c, for example) positioned under the top dielectric 22 that serves as the heat transfer conduit 21 from the heat transfer pad 20 to the via 12. The center solder pot 5 has a smaller area of conductive material 18 (shown in FIG. 5c, for example) that serves as the heat transfer conduit 21. The right-most solder pot 5 has a funnel-shaped area of conductive material 18 (shown in FIG. 5c, for example) that serves as the heat transfer conduit 21. Varying the size and shape of the heat transfer conduit 21 controls the amount of energy transported per unit of time. This allows soldering of wire 30 with lower temperature insulation, lower melt temperatures, etc.

Figure 12:
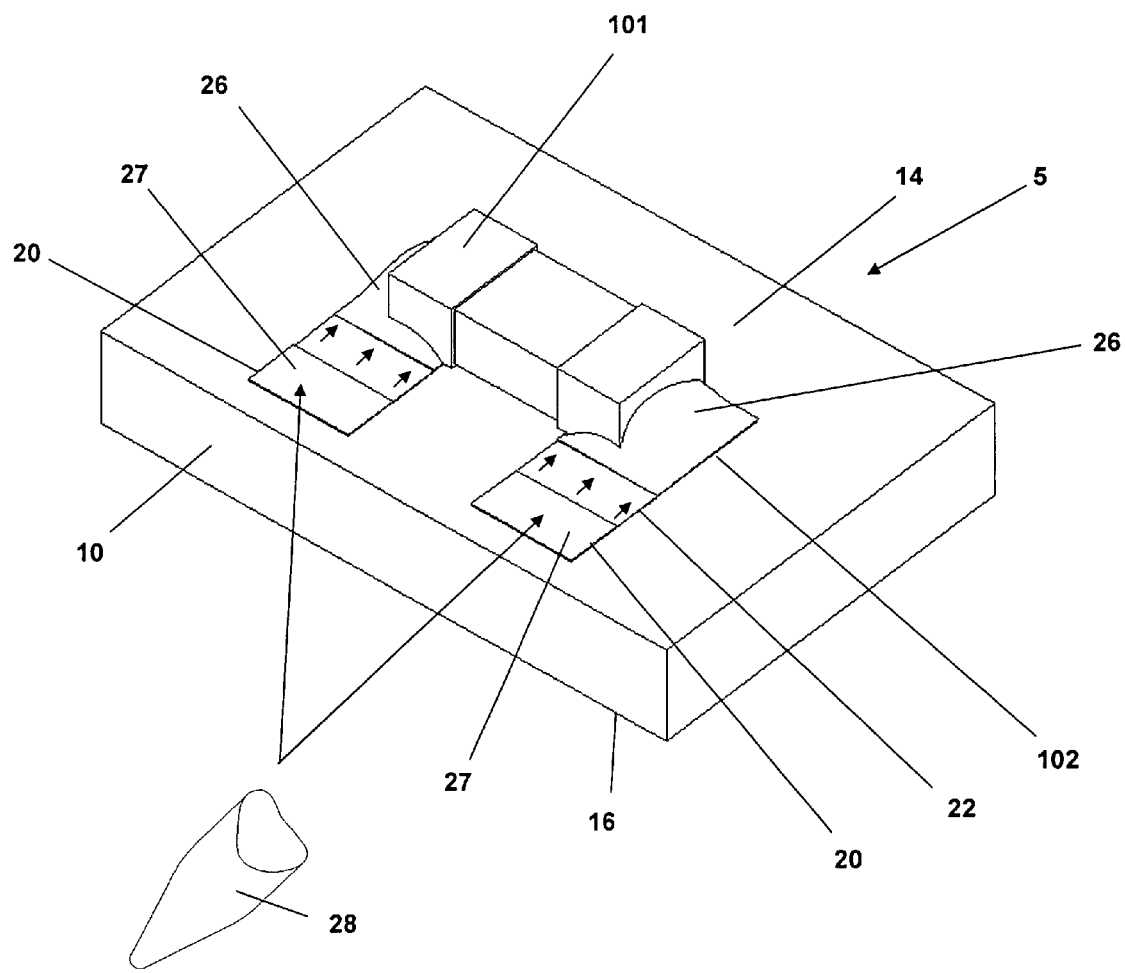
FIG. 12 is a perspective view of another alternative example of the micro solder pot where a component is mounted on a top surface of a substrate utilizing two micro solder pots with the heat transfer pads having heat transfer solder.

FIG. 12 illustrates two micro solder pots 5 being utilized to surface mount a component 30 on a substrate 10. This example allows soldering or unsoldering of surface mount components, such as in the rework or repair of a device; or adding, subtracting, or tuning a resistor after a printed circuit assembly is completed, for example. This allows for soldering without cleaning the printed circuit assembly a second time when performing fluxless soldering or using no-clean flux. In this example, two micro solder pots 5 are utilized. Filling material 26 is positioned in each of the vias 12 that extend partially or completely through the substrate 10. A solder pad 102 is formed on top of the vias 12 such that the filling material 26 is present above the plane of the top surface in the form of a bump or bubble of solder or other filling material 21. A heat transfer pad 20 is connected to each via 12 through the conductive material 18 that is positioned on the substrate 12 under the top dielectric 22. Heat transfer material 27 is positioned on each heat transfer pad 20. When a heat source 28 applies thermal energy to the heat transfer material 27, thermal energy is transferred from the heat transfer pad 20 to the filling material 26 to allow component 101 to be soldered to the substrate. Component 101 may also include pins (not shown) that extend into the underlying vias 12.

Figure 13A:
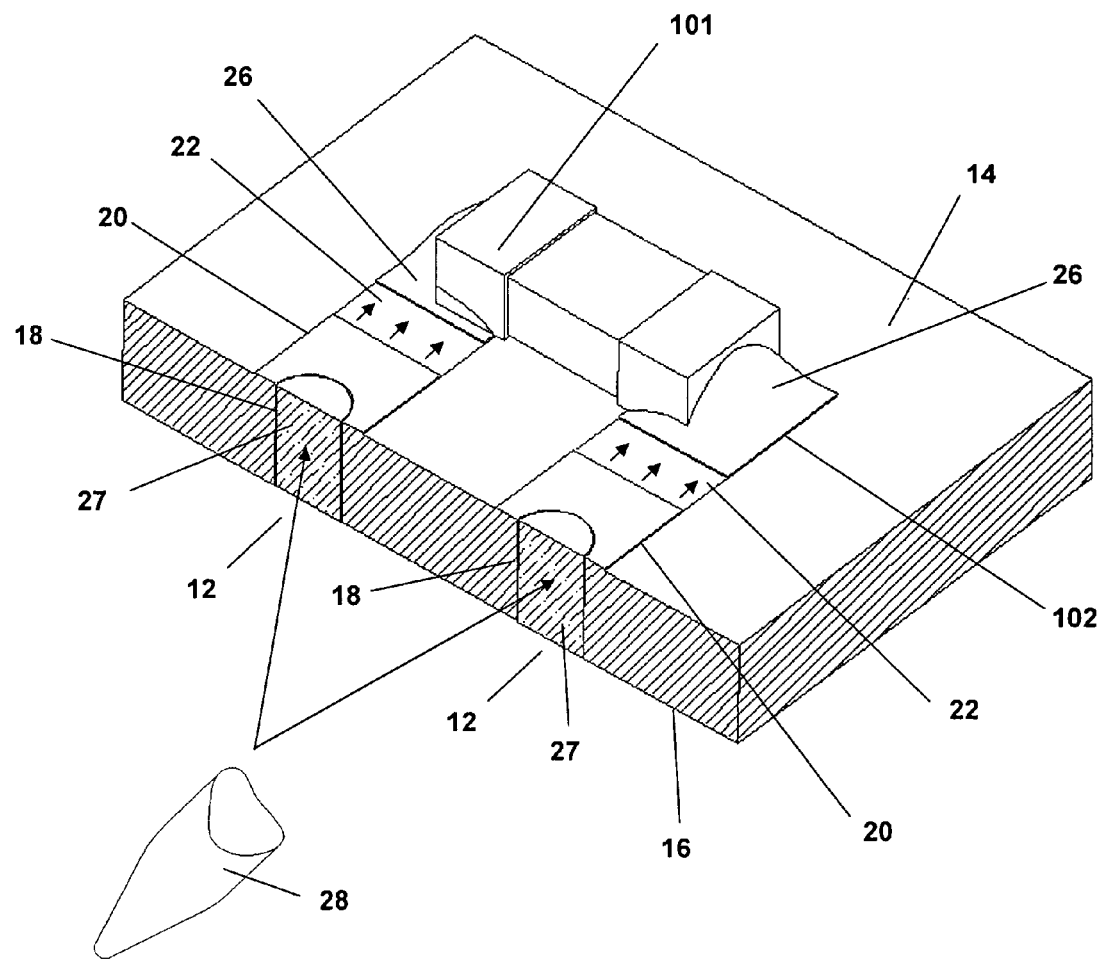
FIG. 13A is a perspective view of another alternative example of the micro solder pot where a component is mounted on a top surface of a substrate utilizing two micro solder pots with heat transfer pads disposed on a side surface of the substrate.

FIG. 13A is similar to FIG. 12, but in this case includes heat transfer pads 20 that are positioned on a first side 14 of the substrate 10 while the heat transfer material 27 is positioned in a recess formed in the side of the substrate 10. Heat applied to the heat transfer material 27 by heating element 28 conducts to the heat transfer pad 20, which conducts to filling material 26 to heat up the solder and fix the component 101 to the first side of the substrate. This example has similar benefits to that discussed above in connection with FIG. 12 and allows side access and a lower chance to contaminate the solder joint.

Figure 13B:
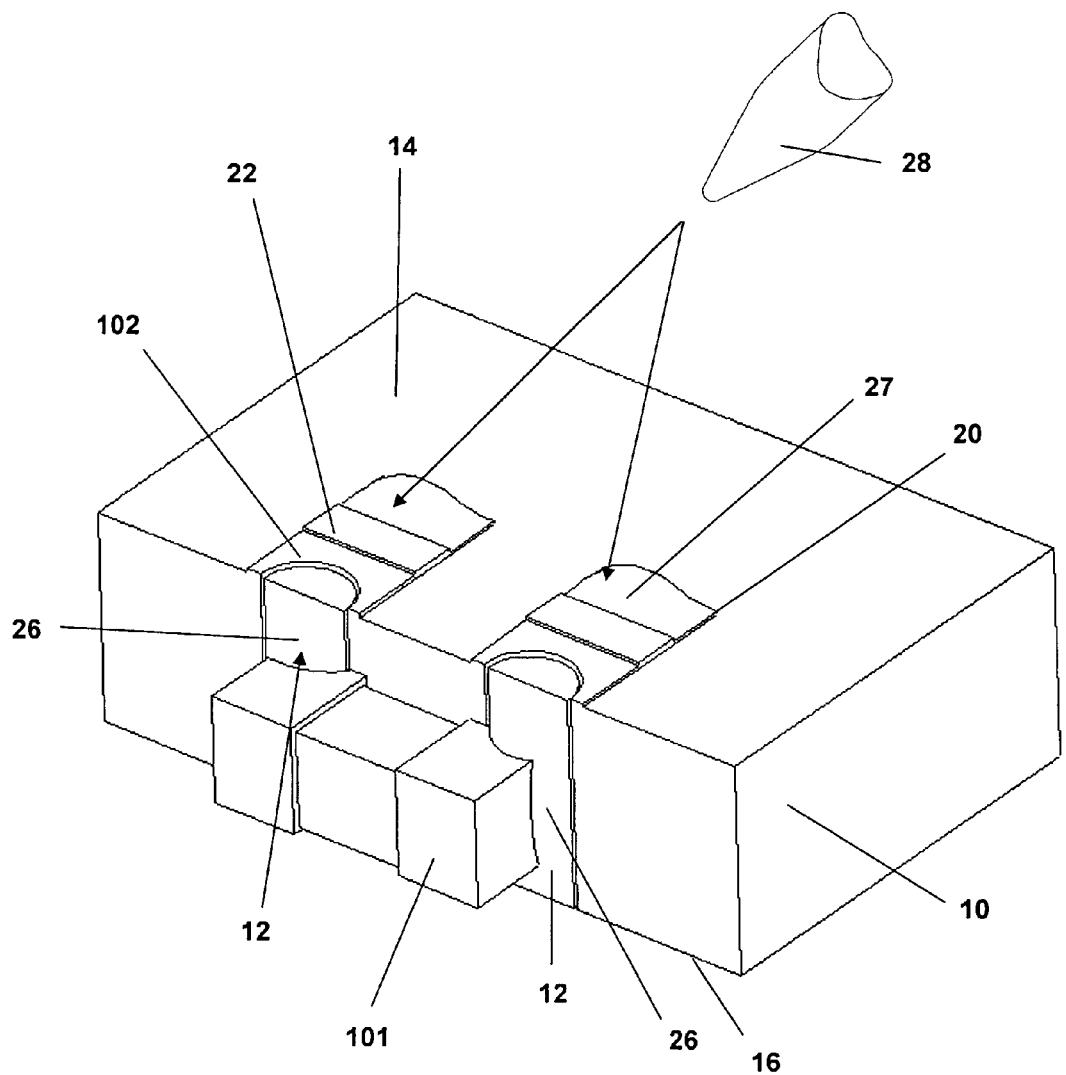
FIG. 13B is a perspective view of an alternative example similar to that shown in FIG. 13A, but with the component being installed on a side of the substrate and the heat transfer pads with heat transfer solder being disposed on a top surface of the substrate.

FIG. 13B is similar to FIG. 13A, but in FIG. 13B, the vias 12 are formed on a side of the substrate 10 and the filling material 26 is positioned in each via 12. These types of vias are called "split vias". The heating pad 20 and the heat transfer material 27 are positioned on the first side of the substrate 10 and are coupled to the vias 12 by the conductive material 18. Conductive material 18 is formed on the first side 14 of the substrate 10 around the edge of the via to define a solder pad 102 around each via 12. A top dielectric 22 is positioned between each heat transfer pad 20 and each solder pad 102. In this example, the component 101 is mounted to the substrate 10 on the side thereof. The filling material 26 in the vias 12 is heated when heat is applied to the heat transfer material 27 by a heating element 28. When the filling material 26 is heated, the component 101 may be mounted to the side surface of the substrate. The component 101 may have pins that extend into the vias 12. Alternatively, the component may not have pins. This example has similar benefits to that discussed above in connection with FIG. 12 and allows side access and a lower chance of contaminating the solder joint. The side mount also allows for more room on top of the substrate for other components.

Figures 14A, 14B:
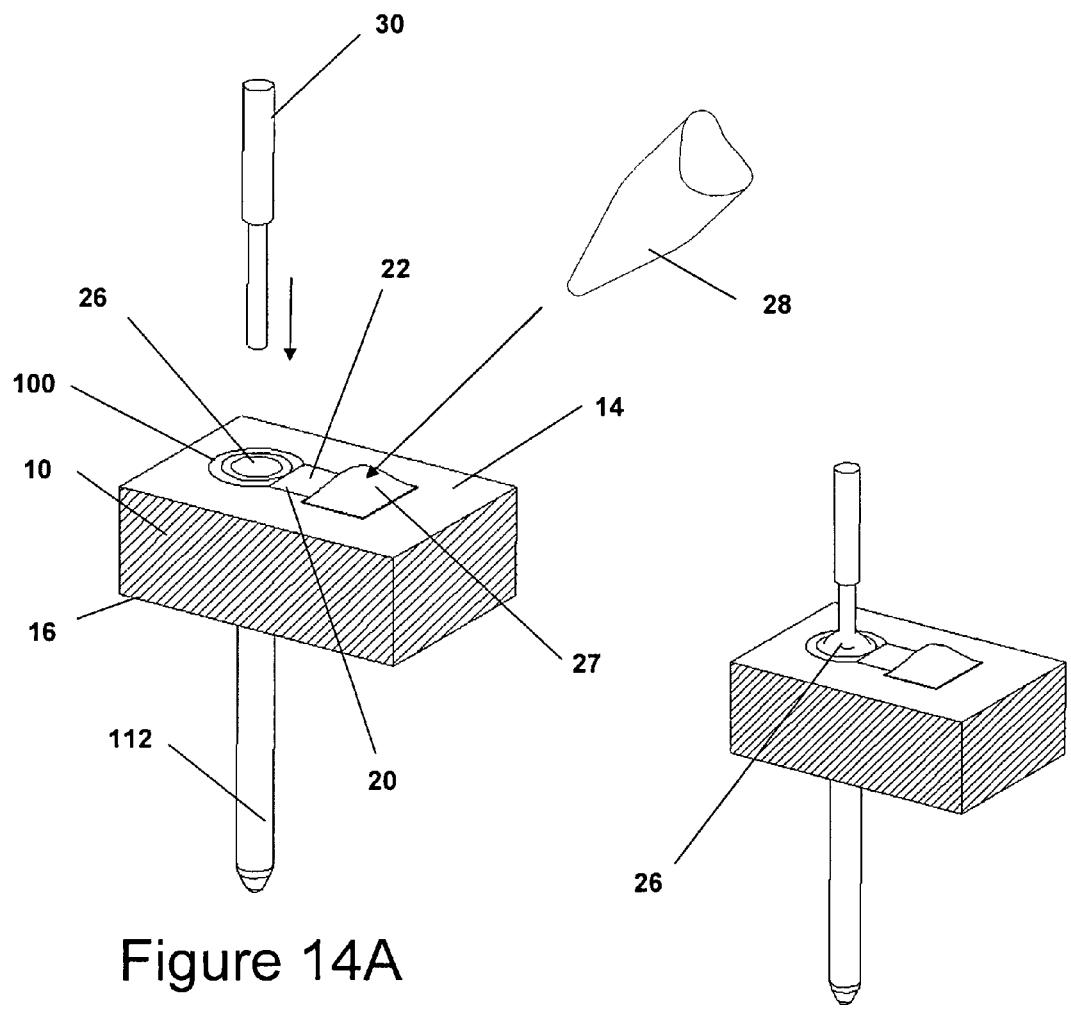
FIG. 14A is a perspective view of an alternative example of the micro solder pot where a pin is installed in a hole in a substrate and the micro solder pot is positioned inside the top end of the pin, with a heat transfer pad having a heat transfer solder coupled to the pin.
FIG. 14B is a perspective view of the example shown in FIG. 14A with the wire installed in the micro solder pot.

FIGS. 14A and 14B depict another example micro solder pot 5 that is formed in a substrate 10. In this example, a pin 112 is positioned in via 12 and extends entirely through the substrate 10 such that the top end of the pin is flush with the first side or top 14 of the substrate 10. In this example, the pin has a via 12a embedded in its upper end. The via 12a is filled with a filling material 26. The filling material may be prefilled or filled once the pin 112 is installed in the via 12. The micro solder pot 5 operates in the same manner as previously discussed, where heat is applied with a heating element 28 to the heat transfer material 27 disposed on top of heating pad 20. Thermal energy is transferred from the heating pad to the annular ring of conductive material 100 disposed around the via 12 on the top side 14 of the substrate 10. This example also utilizes a top dielectric 22 positioned over the conductive conduit, which helps to prevent solder from the heat transfer material 27 to enter the filling material 26. Since the pin 112 includes a via 12 defined in the center of the pin, a wire 30 can be inserted into the filling material 26 upon the application of heat to the heat transfer material 27. The wire or component is in electrical communication with the pin 112. This example allows for change-out of components, wires, and devices.

Figure 15A:
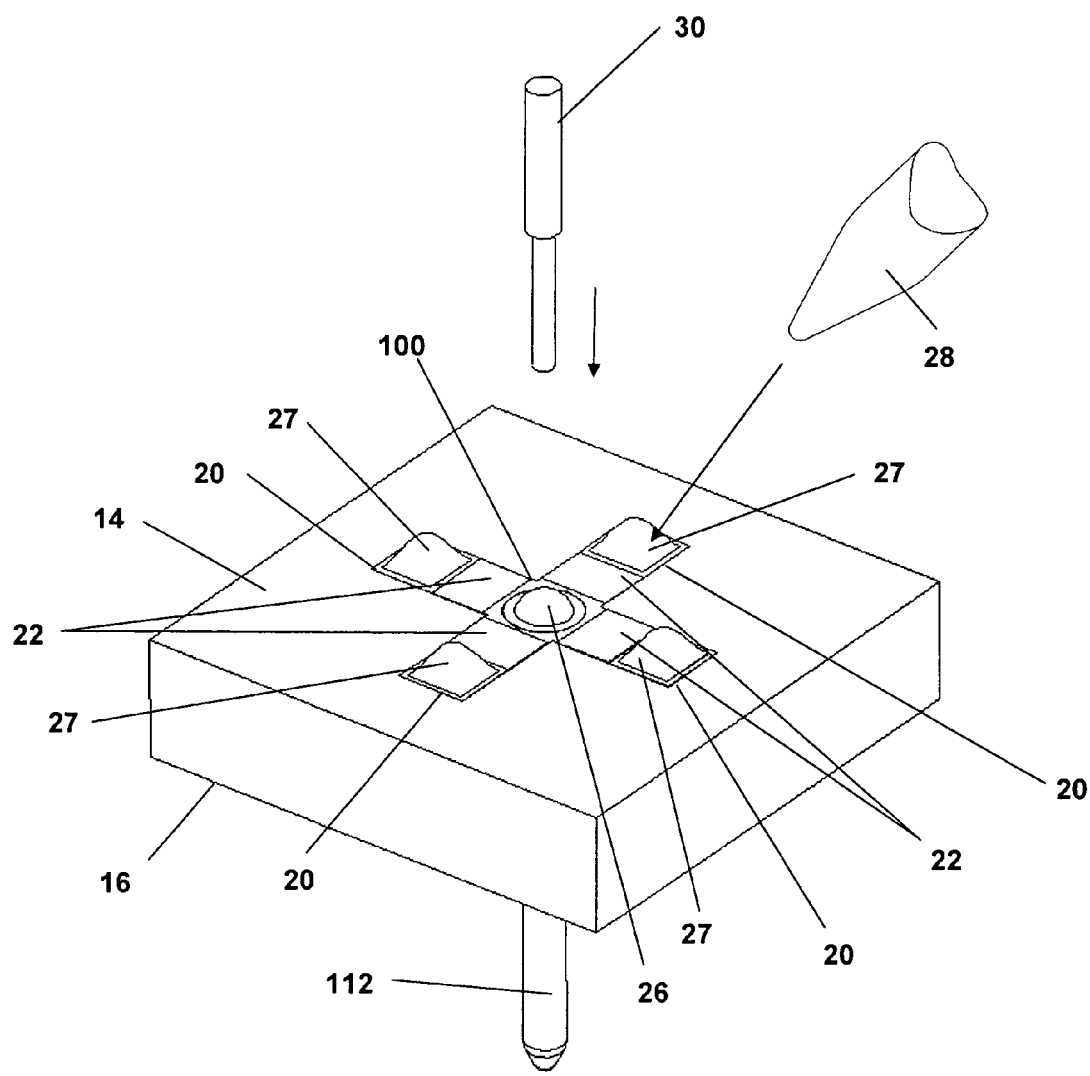
FIG. 15A is a perspective view of yet another example micro solder pot where a single hole is coupled to four heat transfer pads having a heat transfer solder disposed thereon, with each heat transfer pad being in thermal communication with the micro solder pot.
Figure 15B:
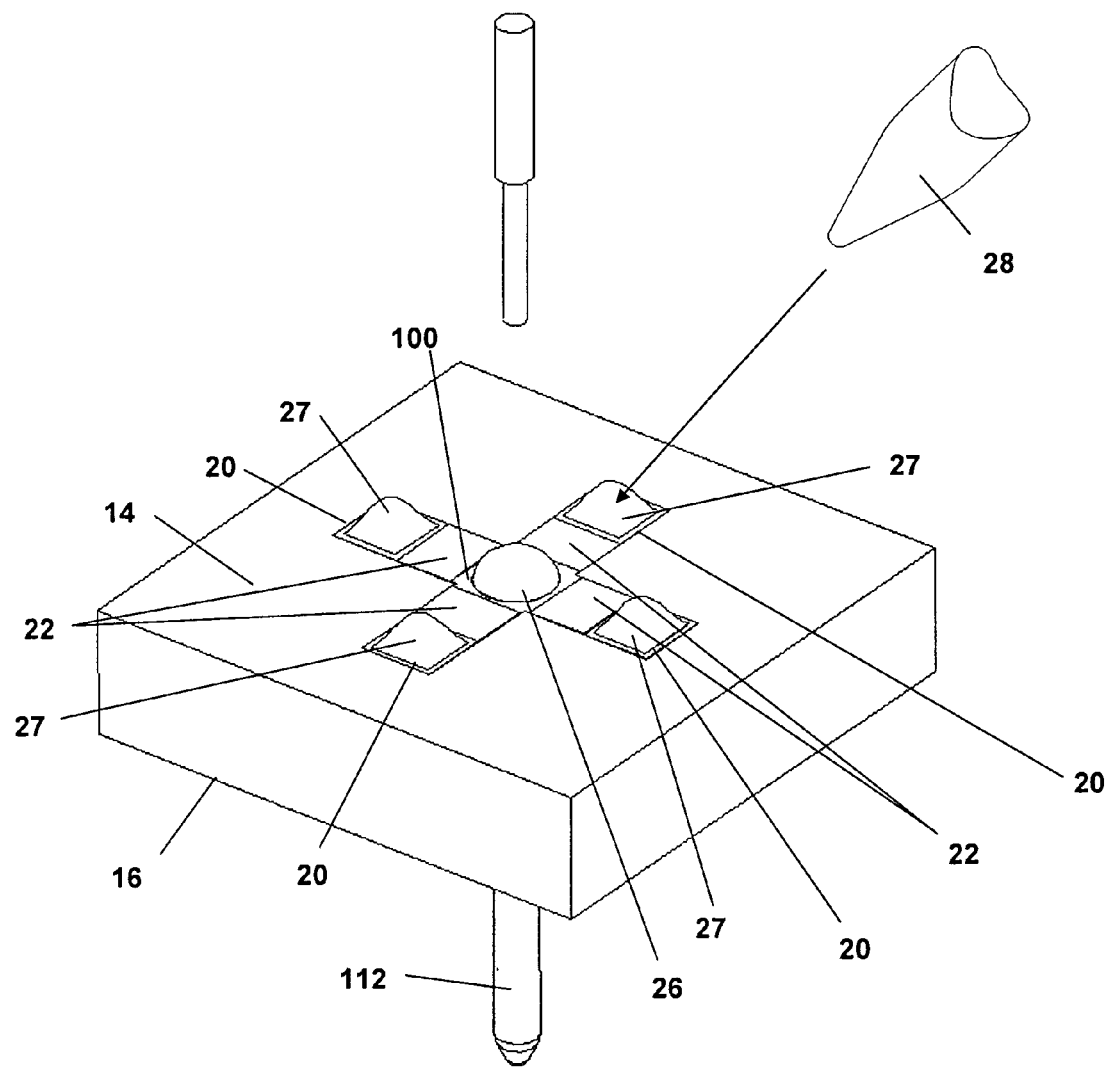
FIG. 15B is a perspective view of yet another example micro solder pot where a single hole is coupled to four heat transfer pads having heat transfer solder.

FIGS. 15A and 15B depict another example of the micro solder pots 5. In this example, four heat transfer pads 20 and their associated conductive materials 18 are coupled to a single via 12. The via 12 is positioned in the center of four heat transfer pads 20, although the heat transfer pads 20 could have a different arrangement. The heat transfer pads 20 each have the heat transfer material 27 in this particular example, but need not have heat transfer material 27. In addition, a first dielectric 22 is positioned between each heat transfer pad 20 and the conductive structure 100 formed on the top side 14 of the substrate 10 around the via 12. In these examples, a pin 112 is positioned in the via 12. The pin may extend all the way through the substrate, as shown in FIG. 15A, or may partially extend along the length of the via 12. Pin 112 may or may not include a hole 12 bored into the center of the pin 112 for receiving the filling material 26 and wire 30. These examples allow multiple access points in multiple direction. Access is provided from multiple sides of the joint, which may provide four times the heat transfer if all four heat transfer pads 20 are utilized at a single time. This means that a larger device or wire and larger thermal mass may be used. The benefits include faster soldering, among other benefits. Heat may be applied to one or more of the heat transfer pads. The examples shown in FIGS. 15A and 15B are also advantageous when one or more of the heat transfer pads are obstructed by other components or parts within the housing since the design provides multiple access points and multiple access directions. The unobstructed heat transfer pad 20, in this case, can be used to heat the filling material to allow insertion of wire 30 into via 12. Thus, the heating pads 20 of FIGS. 15A and 15B can be used either singly or in multiples thereof.

In FIG. 15A, the filling material 26 is positioned in a via 12 in an upper end of the pin 112. The wire 30 may be inserted into the via 12 defined in the upper end of the pin 112 when heat is applied to the heat transfer material such that the solder 26 enters a liquidus state.

In FIG. 15B, the filling material 26 is formed like a bubble of solder over the top of the via 12. The pin may or may not be flush with the top surface 14 of the substrate 10. If the pin is not flush, the solder helps to bind the wire 30 in the opening. In addition, by utilizing solder 26, more variation, tolerance wise, is allowed between the pin and the hole 12. In addition, the use of solder 26 enhances the electrical communication between the pin 112 and the plating around the hole 12. If the pin 112 does not extend to the top 14 of the substrate 10, the via may be kept larger for receiving the wire 30, or another component. In both FIGS. 15A and 15B, the pin may be press fit into via 12. The solder 26 in the via will help to strengthen the bond between the via and the pin 112.

Figures 16A, 16B:
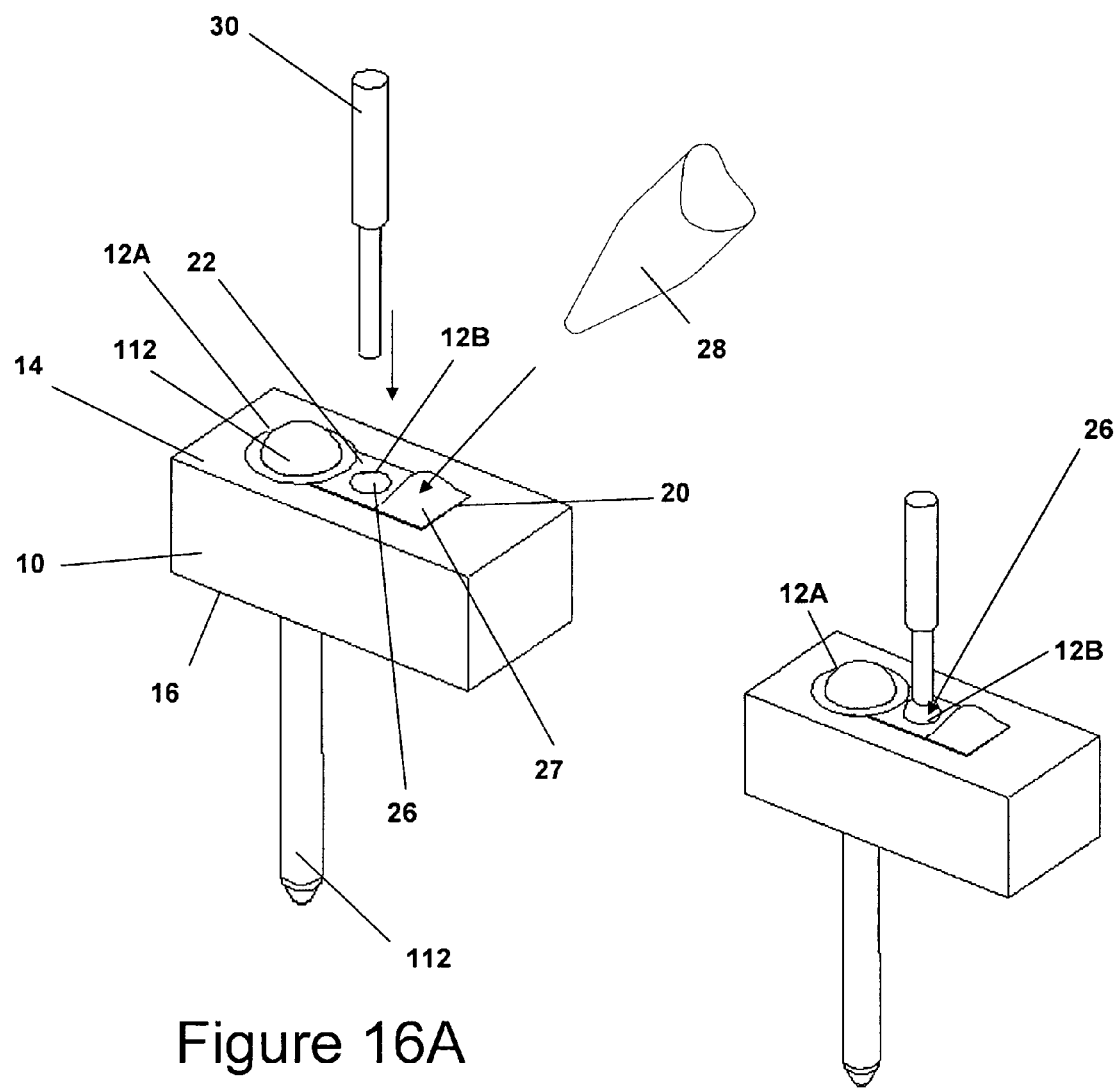
FIG. 16A is a perspective view of a further example micro solder pot where a pin is positioned in a first opening having a solder disposed therein, a heat transfer pad extends from the first opening to and past a second opening, and the heat transfer pad has a heat transfer solder, with a solder mask being positioned over the heat transfer conduit.
FIG. 16B is a perspective view of the example shown in FIG. 16A, with a wire installed in the second hole.

FIGS. 16A and 16B depict an alternative example of the micro solder pot 5 having a heat transfer pad 20 with a heat transfer material positioned thereon. A pin 112 is situated in a first via 12a and a wire 30 is situated in a second via 12b, with the second via 12b being positioned between the heat transfer pad 20 and the first via 12a. A conductive material 18 coats the inside of the first and second vias 12a, 12b, and extends to the top surface 14 of the substrate 10. The conductive material 18 on the top surface 14 of the substrate is arranged around the holes to form a conductive structure 100 that forms a conductive pathway to the heat transfer pad 20. An insulating top dielectric 22, such as a solder mask, is positioned over the conductive material 18. This design allows for an electrical path from wire to pin and is useful in post assembly repair and placement.

Figure 17A:
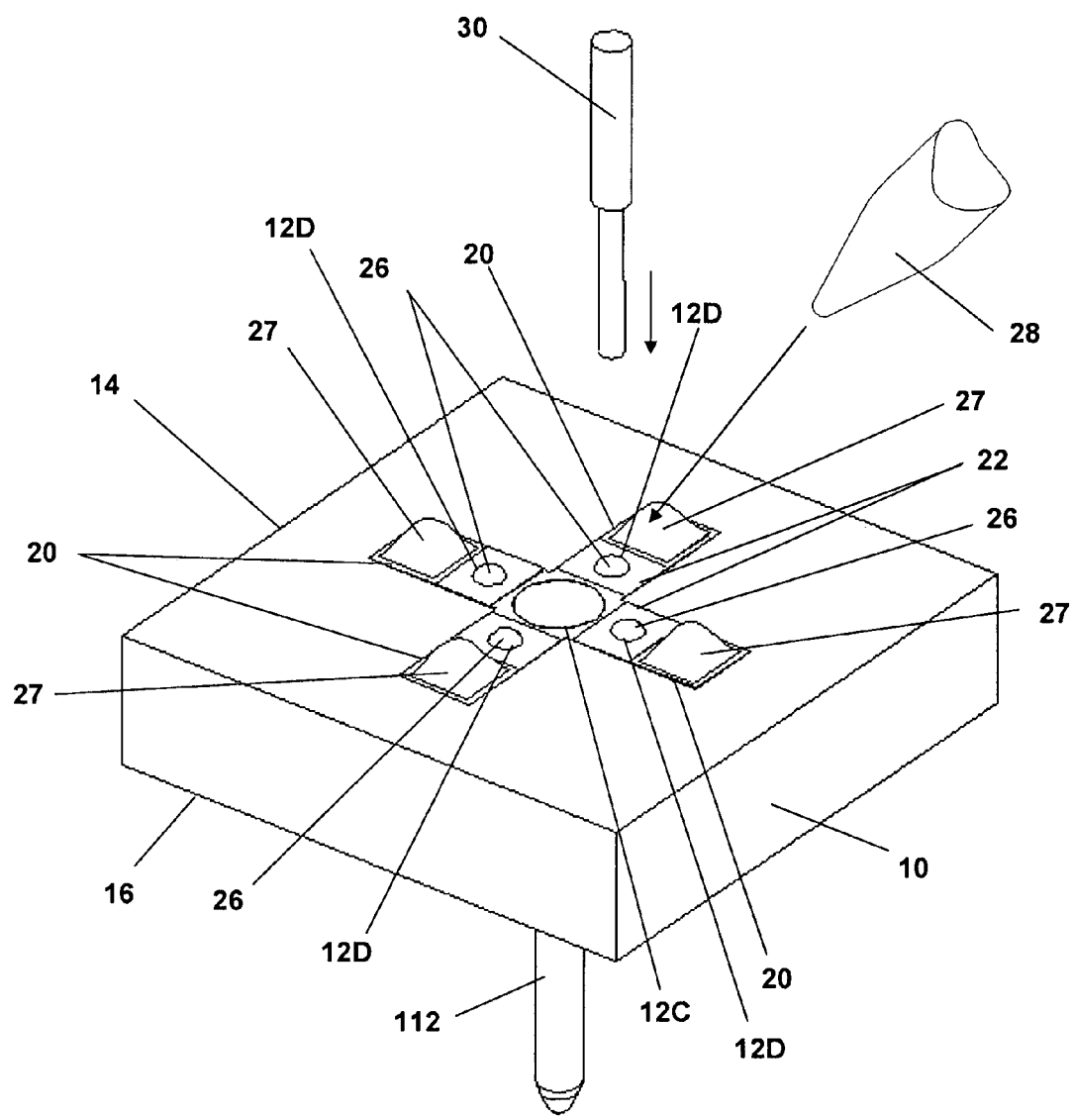
FIG. 17A is perspective view of an alternative example, where a pin is installed through a first hole in a substrate, with four heat transfer pads extending from the pin and each of the four heat transfer pads having a second hole for receiving a wire therein and with heat transfer solder being positioned on each of the heat transfer pads.
Figure 17B:
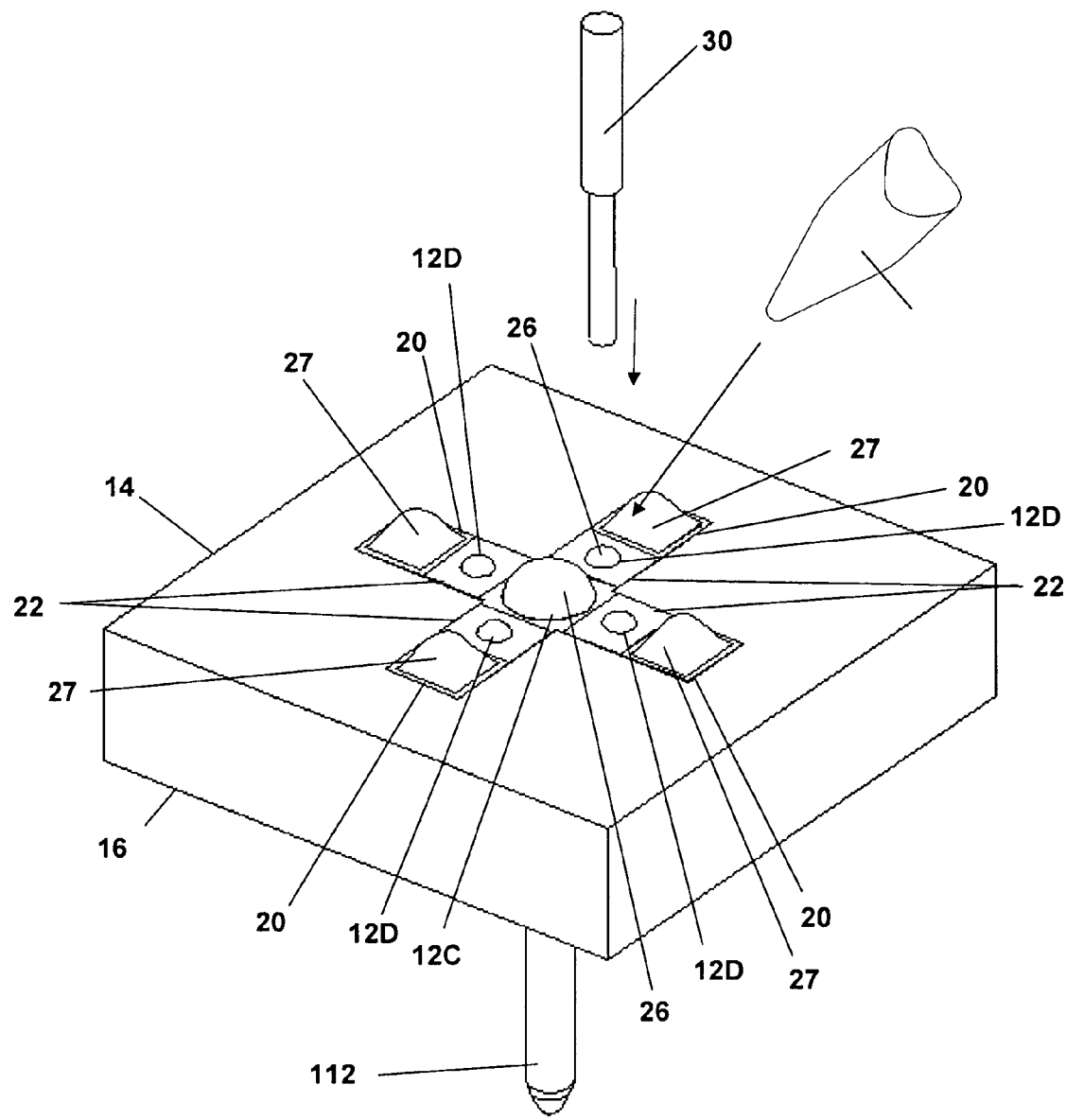
FIG. 17B is similar to the example shown in FIG. 17A, but with the heat transfer solder positioned on top of the first hole, over the pin.

FIG. 16B shows the assembly post insertion of wire 30 into the second via 12b. FIG. 16A shows the top of pin 112 flush with the top surface 14 of the substrate 10. While not shown, solder 26 could be positioned as a bead over the top of the pin head and the solder, when heated by the heat transfer pad 20, could serve to strengthen the bond between the via 12a and the pin 112. The pin 112 could alternatively be recessed into the first via 12a such that the top of the pin 112 is positioned below the top surface 14. Solder or other filling material 26 could be positioned in the first via 12a. This solder would be utilized to strengthen the pin to via bond and could also be used to connect an additional component. The upper end of the pin 112 could include a solder pot formed in the top of the pin 112 so that a component could be inserted into the pin 112, as shown in prior examples. The pin could be used to reflow the solder joint by direct heating of the pin after the assembly has been completed. Since the pin 112 is metallic, heating of the pin 112 serves to heat the conductive material 18 on the inside of the via 12b and the pin. Heat travels up the pin 112 and the conductive material 18 to the solder joint itself, allowing for rework and repair after the assembly is originally completed FIGS. 17A and 17B depict examples where multiple pathways are provided along with multiple wire destinations, with a pin 112 being positioned in the center of the pathways. FIGS. 17A and 17B are essentially a combination of the elements shown in FIGS. 15A and 16A, and 15B and 16B. The pin is inserted into the center of the heat transfer pads 20 in a central via 12c and additional pin-receiving vias 12d are positioned around the central via 12c between the respective heat transfer pads 20 and the central via 12c. Note that vias 12a and 12b are similar to vias 12c and 12d, respectively, except for the fact that via 12c communicates with more than one via 12d. Similar to prior examples, the conductive material 18 and the filling material 26 are heated upon application of heat to the heat transfer material 27 and heat transfer pad 20 by a heating element 28. The pin 112 in the depicted example is shown flush with the top surface 14 of the insulating substrate 10, but could also be recessed below the surface. While the pin 112 is preferably press fitted into the central via 12c, solder 26 may be utilized to further solidify the joint between the pin 112 and via 12c, a shown in FIG. 17B. Alternatively, as discussed above, the pin 112 could be recessed beneath the top surface 14, or a solder pot 5 could be formed in the top end of the pin for receiving a filling material 26. The pin 112 may be pre-tinned or filled with solder 26 before the pin is installed in the via.

Figure 18A:
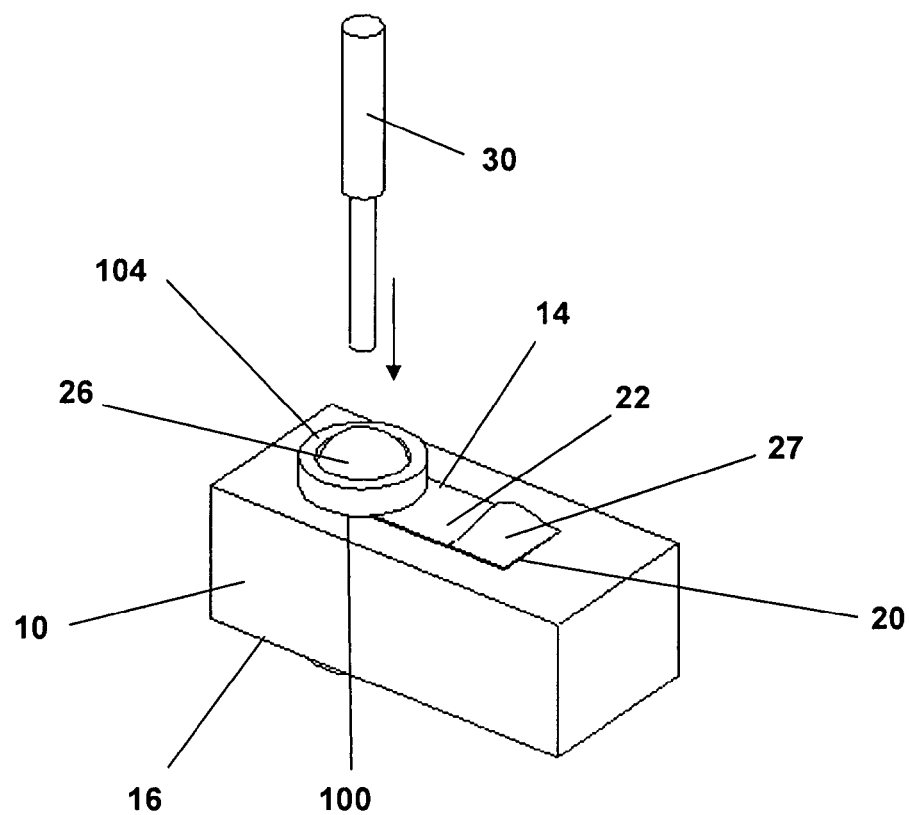
FIG. 18A is a perspective view of yet another example micro solder pot, where an eyelet is installed in a through hole in the substrate, with the heat transfer pad being in thermal communication with the eyelet.
Figure 18B:
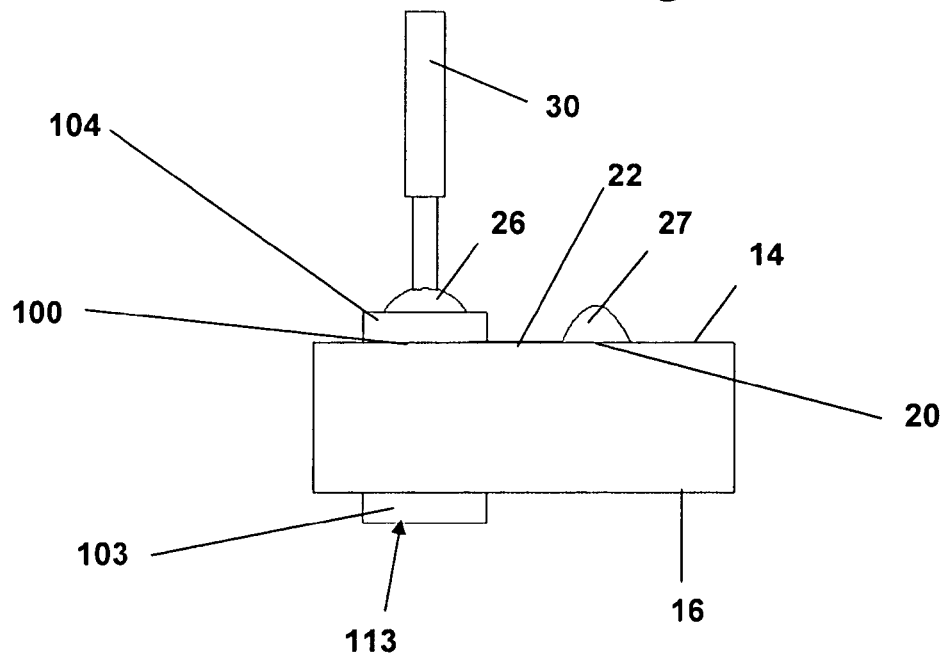
FIG. 18B is a side view of the micro solder pot of FIG. 18A.

FIGS. 18A and 18B show an alternative low cost example of the micro solder pot, where an eyelet 113 is utilized instead of coating the interior of a via 12 with a conductive material 18, as previously shown in FIGS. 1-5, for example. The eyelet 113 is cylindrical in the depicted examples, but could be different shapes depending upon the shape of the via 12. In the depicted examples of FIGS. 18A and 18B, an eyelet 113, or rivet-like structure is positioned inside a via 12. The eyelet 113 shown has a top eyelet structure 104 that sits on the top surface 14 of the substrate 10 and a bottom eyelet structure 103 that sits on the bottom surface 16 of substrate 10. The eyelet 113 could be a metal cylinder with a blind hole that is drilled partway through the one end face, with the cylinder pressed into the hole 12. Other eyelets could be utilized where the hole in the eyelet 113 is a through hole. A conductive material 18 is positioned around the via 12 on the top surface 14 of the substrate 100 and creates a conductive pathway from the heat transfer pad 20 to the via. Since the eyelet top flange 104 seats on the conductive material 18, thermal energy may be transferred from the heat transfer material to the heat transfer pad, under the top dielectric 22 to the eyelet 113. When an eyelet 113 is used, the inside of the via 12 does not need to be coated with the conductive material. This results in a low cost plated through hole, with no via plating required. Other inserts may also be utilized instead of an eyelet 113, such as a pin without a tip, for example.

While the micro solder pot 5 has been discussed in connection with its application to a printed circuit board, it should be realized that the same solder pot could be used on a larger scale. Thus, the term micro, as used herein, should not be limited to micro environments, but should be construed to apply to any size environment. The above described technology scales very well. The most important considerations are the aspect ratio between the hole diameter and the hole depth, and the ability of the filling material 26 to span any given hole diameter.

While the via or hole 12 has been shown as circular and having a cylindrical shape, it will be readily recognized by one of skill in the art that any size and shape of hole may be utilized. For example, many non-circular hole shapes are contemplated, such as oval, square, rectangular, and triangular, among other known shapes. The examples claimed are not to be limited to a circular, cylindrical hole 12. In addition, while a single layer substrate is shown in the drawings, it should be understood by those of skill in the art that the above described examples may be equally used in a multi-layer substrate, such as a multi-layer substrate. Thus, the claims are not to be limited to a single layer substrate.

It will be appreciated by those of ordinary skill in the art that the concepts and techniques described herein can be embodied in various specific forms without departing from the essential characteristics thereof. The presently disclosed examples are considered in all respects to be illustrative and not restrictive. The scope of the invention is indicated by the appended claims, rather than the foregoing description, and all changes that come within the meaning and range of equivalents thereof are intended to be embraced.

What is claimed is:

1. An apparatus comprising:
    a dielectric substrate having a hole that is open on a side of the substrate;
    a thermally conductive coating within the hole;
    a solid body of thermally formable, electrically conductive filling material within the hole in thermal communication with the coating;
    a heat transfer pad located on the side of the substrate in a position spaced from the hole and the filling material;
    a thermally conductive structure extending over the side of the substrate from the heat transfer pad to the coating within the hole to provide a conduit for conducting thermal energy from the heat transfer pad to the solid body of filling material in the hole; and
    a dielectric material positioned over the thermally conductive structure in a configuration interposed between the heat transfer pad and the solid body of filling material as a barrier to the flow of molten material from the heat transfer pad to the filling material.

2. An apparatus as defined in claim 1 wherein the solid body of filling material fills the hole and is exposed at the side of the substrate to be accessible for insertion of an electrical conductor into the filling material.

3. An apparatus as defined in claim 1 further comprising a conductor extending into the hole and joined to the filling material within the hole.

4. An apparatus as defined in claim 3 wherein the conductor is a wire with a nonlinear section embedded in the filling material within the hole.

5. An apparatus as defined in claim 1 wherein the heat transfer pad and the thermally conductive structure are recessed at the surface of the substrate.

6. An apparatus as defined in claim 1 wherein the hole contains a counter bore.

7. An apparatus as defined in claim 1 wherein the hole contains a counter sink.

8. An apparatus as defined in claim 1 wherein the hole extends through the substrate along an edge of the substrate.

9. An apparatus comprising:
a dielectric substrate having a hole that is open on a side of the substrate;
a thermally conductive coating within the hole;
a solid body of thermally formable, electrically conductive filling material within the hole in thermal communication with the coating;
a heat transfer pad located on the side of the substrate in a position spaced from the hole and the filling material;
a thermally conductive structure extending over the side of the substrate from the heat transfer pad to the coating within the hole to provide a conduit for conducting thermal energy from the heat transfer pad to the solid body of filling material in the hole; and
a solid body of thermally formable heat transfer material that is mounted on the heat transfer pad and exposed at the side of the substrate to be accessible to a soldering iron or other heating tool so as to conduct thermal energy from the heating tool to the heat transfer pad;
further comprising a dielectric material positioned over the thermally conductive structure in a configuration interposed between the heat transfer pad and the solid body of filling material as a barrier to the flow of molten material from the heat transfer pad to the filling material.

10. An apparatus as defined in claim 9 wherein the solid body of filling material fills the hole and is exposed at the side of the substrate to be accessible for insertion of an electrical conductor into the filling material.

11. An apparatus as defined in claim 9 further comprising a conductor extending into the hole and joined to the filling material within the hole.

12. An apparatus as defined in claim 11 wherein the conductor is a wire with a nonlinear section embedded in the filling material within the hole.

13. An apparatus as defined in claim 9 wherein the heat transfer pad and the thermally conductive structure are recessed at the surface of the substrate.

14. An apparatus as defined in claim 9 wherein the hole contains a counter bore.

15. An apparatus as defined in claim 9 wherein the hole contains a counter sink.

16. An apparatus as defined in claim 9 wherein the hole extends through the substrate along an edge of the substrate.

17. An apparatus comprising:
a dielectric substrate having a blind hole that is open on a side of the substrate and extends only partially through the substrate;
a thermally conductive coating within the hole;
a solid body of thermally formable, electrically conductive filling material within the hole in thermal communication with the coating;
a heat transfer pad located on the side of the substrate in a position spaced from the hole and the filling material; and
a thermally conductive structure extending over the side of the substrate from the heat transfer pad to the coating within the hole to provide a conduit for conducting thermal energy from the heat transfer pad to the solid body of filling material in the hole;
further comprising a dielectric material positioned over the thermally conductive structure in a configuration interposed between the heat transfer pad and the solid body of filling material as a barrier to the flow of molten material from the heat transfer pad to the tilling material in the hole.

18. An apparatus as defined in claim 17 further comprising a solid body of thermally formable heat transfer material that is mounted on the heat transfer pad and exposed at the side of the substrate to be accessible to a soldering iron or other heating tool so as to conduct thermal energy from the heating tool to the heat transfer pad.

19. An apparatus as defined in claim 17 wherein the solid body of filling material fills the hole and is exposed at the side of the substrate to be accessible for insertion of an electrical conductor into the filling material.

20. An apparatus as defined in claim 17 further comprising a conductor extending into the hole and joined to the filling material within the hole.

21. An apparatus as defined in claim 17 wherein the conductor is a wire with a nonlinear section embedded in the filling material within the hole.

22. An apparatus as defined in claim 17 wherein the heat transfer pad and the thermally conductive structure are recessed at the surface of the substrate.

23. An apparatus comprising:
a dielectric substrate having a hole with an open end on a side of the substrate;
a thermally conductive coating within the hole;
a solid body of thermally formable, electrically conductive filling material within the hole in thermal communication with the coating;
a heat transfer pad located on the side of the substrate in a position spaced from the hole and the filling material, the heat transfer pad being smaller than the open end of the hole; and
a thermally conductive structure extending over the side of the substrate from the heat transfer pad to the coating within the hole to provide a conduit for conducting thermal energy from the heat transfer pad to the solid body of filling material in the hole;
further comprising a dielectric material positioned over the thermally conductive structure in a configuration interposed between the heat transfer pad and the solid body of filling material as a barrier to the flow of molten material from the heat transfer pad to the filling material in the hole.

24. An apparatus as defined in claim 23 further comprising a conductor extending into the hole and joined to the filling material within the hole.

25. An apparatus as defined in claim 24 wherein the conductor is a wire with a nonlinear section embedded in the filling material within the hole.

26. An apparatus as defined in claim 25 wherein the nonlinear section of the wire comprises one or more of a loop bend, a "V" bend, a "W" bend, a "Vertical V" bend, an end ball, a "C" bend, and a swaged end.

27. An apparatus as defined in claim 23 further comprising a solid body of thermally formable heat transfer material that is mounted on the heat transfer pad and exposed at the side of the substrate to be accessible for contact by a soldering iron or other heating tool so as to conduct thermal energy from the heating tool to the heat transfer pad.

28. An apparatus as defined in claim 23 wherein the solid body of filling material fills the hole and is accessible at the side of the substrate for insertion of the wire.

29. An apparatus as defined in claim 23 wherein the heat transfer pad and the thermally conductive structure are recessed at the surface of the substrate.

30. An apparatus as defined in claim 23 wherein the hole contains a counter bore.

31. An apparatus as defined in claim 23 wherein the hole contains a counter sink.

32. An apparatus as defined in claim 23 wherein the hole extends through the substrate along an edge of the substrate.

* * * * *